(12) United States Patent
Lee et al.

(10) Patent No.: US 11,217,695 B2
(45) Date of Patent: Jan. 4, 2022

(54) SEMICONDUCTOR DEVICES

(71) Applicant: Samsung Electronics Co., Ltd., Suwon-si (KR)

(72) Inventors: Sanghoon Lee, Seongnam-si (KR); Krishna Bhuwalka, Suwon-si (KR); Myunggil Kang, Suwon-si (KR); Kyoungmin Choi, Seoul (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/815,744

(22) Filed: Mar. 11, 2020

(65) Prior Publication Data

US 2020/0381555 A1 Dec. 3, 2020

(30) Foreign Application Priority Data

Jun. 3, 2019 (KR) ........................ 10-2019-0065304

(51) Int. Cl.
*H01L 29/786* (2006.01)
*H01L 29/423* (2006.01)
*H01L 27/088* (2006.01)
*H01L 29/78* (2006.01)
*H01L 29/06* (2006.01)
(Continued)

(52) U.S. Cl.
CPC .. *H01L 29/7851* (2013.01); *H01L 21/823431* (2013.01); *H01L 27/0886* (2013.01); *H01L 29/0673* (2013.01); *H01L 29/1054* (2013.01); *H01L 29/42392* (2013.01); *H01L 29/78696* (2013.01)

(58) Field of Classification Search
CPC ............ H01L 27/0886; H01L 27/0922; H01L 27/0924; H01L 29/0673; H01L 29/1054; H01L 29/42392; H01L 29/785; H01L 29/78696
See application file for complete search history.

(56) References Cited

U.S. PATENT DOCUMENTS 7,791,107 B2  9/2010 Gupta et al.
8,293,608 B2  10/2012 Orlowski et al.
(Continued)

FOREIGN PATENT DOCUMENTS

CN  109103262 A  * 12/2018  ............ B82Y 10/00
KR  10-2006-0046879  5/2006

*Primary Examiner* — Earl N Taylor
(74) *Attorney, Agent, or Firm* — Myers Bigel, P.A.

(57) ABSTRACT

Semiconductor devices are provided. A semiconductor device includes a fin structure having a plurality of first semiconductor patterns and a plurality of second semiconductor patterns alternately stacked on a substrate, and extending in a first direction. The semiconductor device includes a semiconductor cap layer on an upper surface of the fin structure, and extending along opposite side surfaces of the fin structure in a second direction crossing the first direction. The semiconductor device includes a gate electrode on the semiconductor cap layer, and extending in the second direction. The semiconductor device includes a gate insulating film between the semiconductor cap layer and the gate electrode. Moreover, the semiconductor device includes a source/drain region connected to the fin structure. The plurality of first semiconductor patterns include silicon germanium (SiGe) having a germanium (Ge) content in a range of 25% to 35%, and the plurality of second semiconductor patterns include silicon (Si).

19 Claims, 16 Drawing Sheets

(51) Int. Cl.
 *H01L 29/10* (2006.01)
 *H01L 21/8234* (2006.01)

(56) References Cited

U.S. PATENT DOCUMENTS

| | | | |
|---|---|---|---|
| 9,362,179 B1* | 6/2016 | Cheng | H01L 21/823821 |
| 9,412,849 B1* | 8/2016 | Suk | H01L 29/66795 |
| 9,425,318 B1* | 8/2016 | Hoentschel | H01L 29/66545 |
| 9,608,116 B2* | 3/2017 | Ching | H01L 21/823481 |
| 9,728,405 B2 | 8/2017 | Barraud et al. | |
| 9,755,017 B1 | 9/2017 | Guillorn et al. | |
| 9,905,672 B2 | 2/2018 | Wang et al. | |
| 10,014,393 B2 | 7/2018 | Song et al. | |
| 10,068,970 B2 | 9/2018 | Cheng et al. | |
| 10,103,238 B1 | 10/2018 | Zang et al. | |
| 10,756,089 B2* | 8/2020 | Chiang | H01L 29/78696 |
| 2005/0184316 A1* | 8/2005 | Kim | H01L 29/785 257/213 |
| 2008/0001171 A1* | 1/2008 | Tezuka | H01L 29/1054 257/191 |
| 2008/0135949 A1* | 6/2008 | Lo | B82Y 10/00 257/401 |
| 2008/0261358 A1* | 10/2008 | Sonsky | H01L 29/7824 438/197 |
| 2015/0263095 A1* | 9/2015 | Chan | H01L 29/0808 257/17 |
| 2016/0079422 A1 | 3/2016 | Rachmady et al. | |
| 2016/0276484 A1 | 9/2016 | Kim et al. | |
| 2016/0276494 A1* | 9/2016 | Barraud | H01L 21/02667 |
| 2017/0104061 A1* | 4/2017 | Peng | H01L 29/42392 |
| 2019/0355724 A1* | 11/2019 | Chiang | H01L 21/324 |
| 2020/0020689 A1* | 1/2020 | Ohtou | H01L 29/78618 |
| 2020/0111872 A1* | 4/2020 | Reboh | H01L 29/78696 |
| 2020/0357884 A1* | 11/2020 | Xie | H01L 29/0649 |
| 2020/0365467 A1* | 11/2020 | Cheng | H01L 29/6681 |
| 2020/0381555 A1* | 12/2020 | Lee | H01L 29/1054 |
| 2021/0057419 A1* | 2/2021 | Shin | H01L 27/10894 |
| 2021/0066294 A1* | 3/2021 | Huang | H01L 21/823412 |

\* cited by examiner

SEMICONDUCTOR DEVICES

CROSS-REFERENCE TO RELATED APPLICATION(S)

This application claims the benefit of priority to Korean Patent Application No. 10-2019-0065304 filed on Jun. 3, 2019 in the Korean Intellectual Property Office, the disclosure of which is incorporated herein by reference in its entirety.

BACKGROUND

The present inventive concept relates to semiconductor devices. Recently, semiconductor devices have been designed to be down-scaled. In addition, as demand has increased for a semiconductor device having a high operating speed with accuracy in operation, a large volume of studies into optimization of a structure of a transistor included in a semiconductor device have been conducted. As one scaling technique to improve density of an integrated circuit device, a semiconductor device including a FinFET having a channel having a three-dimensional structure in which an active fin is formed on a substrate and a gate is formed using the active fin has been developed.

SUMMARY

An aspect of the present inventive concept is to provide a semiconductor device having a channel having a three-dimensional structure with improved electrical characteristics.

According to an aspect of the present inventive concept, a semiconductor device includes a substrate. The semiconductor device may include a fin structure having a plurality of first semiconductor patterns and a plurality of second semiconductor patterns, alternately stacked on the substrate, and extending in a first direction. The semiconductor device may include a semiconductor cap layer on an upper surface of the fin structure, and extending along opposite side surfaces of the fin structure in a second direction crossing the first direction. The semiconductor device may include a gate electrode on the semiconductor cap layer and extending in the second direction. The semiconductor device may include a gate insulating film between the semiconductor cap layer and the gate electrode. Moreover, the semiconductor device may include a source/drain region connected to one of the side surfaces of the fin structure in the first direction. The plurality of first semiconductor patterns may include silicon germanium (SiGe) and the plurality of second semiconductor patterns may include silicon (Si). Each of the plurality of first semiconductor patterns may have a first germanium (Ge) content gradient that increases toward a first center thereof in a vertical thickness direction thereof. A first Ge content in the first center of each of the first semiconductor patterns may be in a first range of 25% to 35%.

According to an aspect of the present inventive concept, a semiconductor device includes a substrate. The semiconductor device may include a fin structure having a plurality of first semiconductor patterns and a plurality of second semiconductor patterns alternately stacked on the substrate. The semiconductor device may include a gate electrode on an upper surface of the fin structure, and extending along opposite side surfaces of the fin structure. The semiconductor device may include a gate insulating film between the fin structure and the gate electrode. Moreover, the semiconductor device may include source/drain regions connected to the opposite side surfaces, respectively, of the fin structure. The plurality of first semiconductor patterns may include silicon germanium (SiGe). Each of the plurality of first semiconductor patterns may have a germanium (Ge) content gradient that increases toward a center thereof in a vertical thickness thereof. A Ge content in the center of each of the first semiconductor patterns may be in a range of 25% to 35%.

According to an aspect of the present inventive concept, a semiconductor device includes a substrate. The semiconductor device may include a first transistor in a first region of the substrate. The first transistor may include a plurality of channel layers spaced apart from each other in a direction perpendicular to an upper surface of the substrate. The first transistor may include a first gate electrode surrounding the plurality of channel layers. The first transistor may include a first gate insulating film between the plurality of channel layers and the first gate electrode. The first transistor may include first source/drain regions on opposite side surfaces, respectively, of the plurality of channel layers, and connected to each of the plurality of channel layers. The semiconductor device may include a second transistor in a second region of the substrate. The second transistor may include a fin structure having a plurality of first semiconductor patterns and a plurality of second semiconductor patterns, alternately stacked. The second transistor may include a second gate electrode on an upper surface and side surfaces of the fin structure. The second transistor may include a second gate insulating film between the fin structure and the second gate electrode. The second transistor may include second source/drain regions on the side surfaces, respectively, of the fin structure and connected to the plurality of first semiconductor patterns. Moreover, the plurality of first semiconductor patterns may include silicon germanium (SiGe) having a germanium (Ge) content in a range of 25% to 35%.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, embodiments of the present inventive concept will be described as follows with reference to the accompanying drawings.

Figure 1:
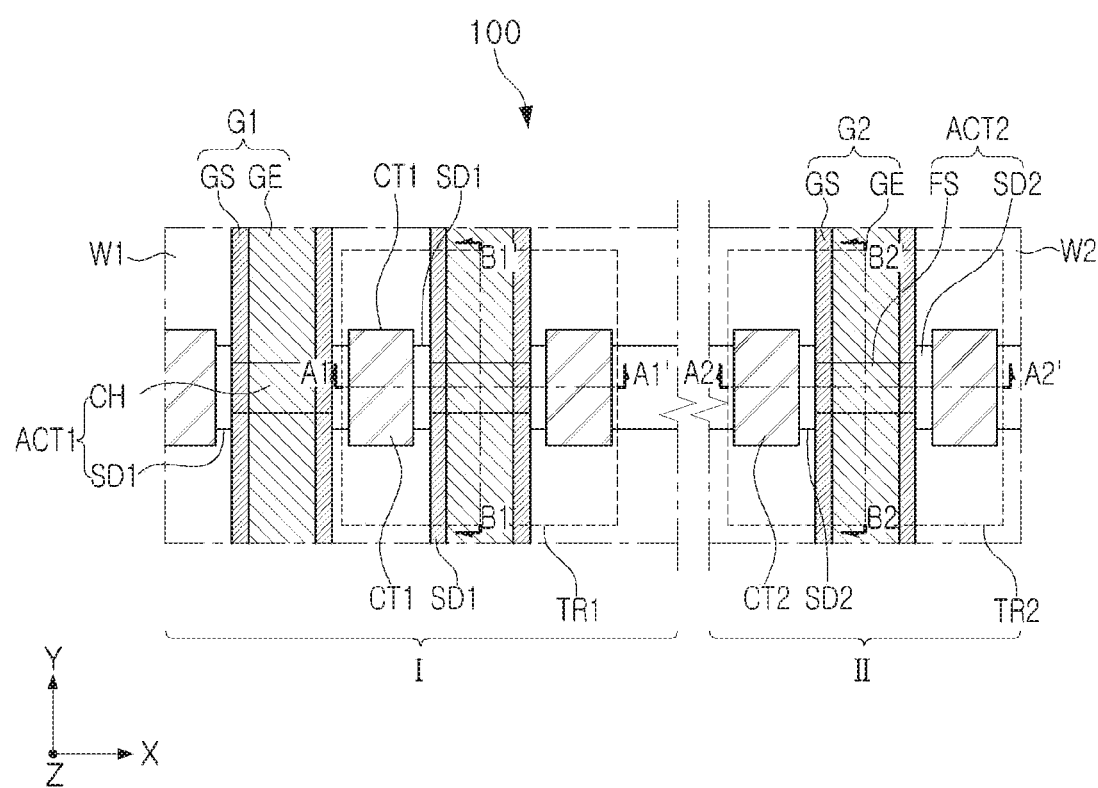
FIG. 1 is a plan view illustrating a semiconductor device according to an example embodiment of the present inventive concept.
Figure 2A:
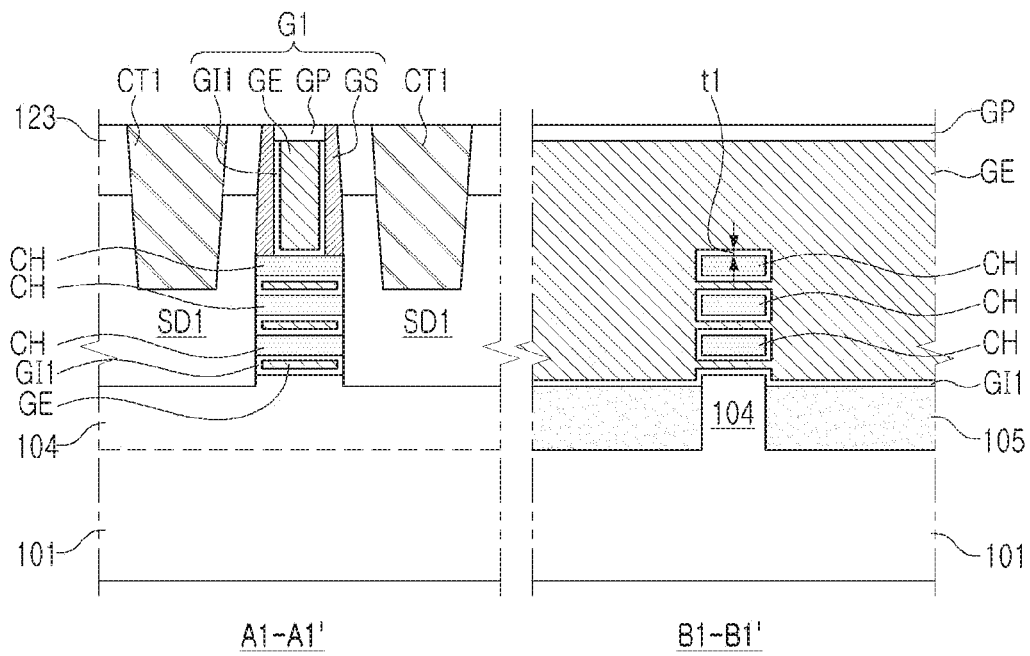
FIG. 2A is a cross-sectional view taken along lines A1-A1' and B1-B1' of FIG. 1.

FIG. 1 is a plan view illustrating a semiconductor device according to an example embodiment of the present inventive concept. FIG. 2A is a cross-sectional view taken along lines A1-A1' and B1-B1' of FIG. 1, and FIG. 2B is a cross-sectional view taken along lines A2-A2' and B2-B2' of FIG. 1.

Figure 2B:
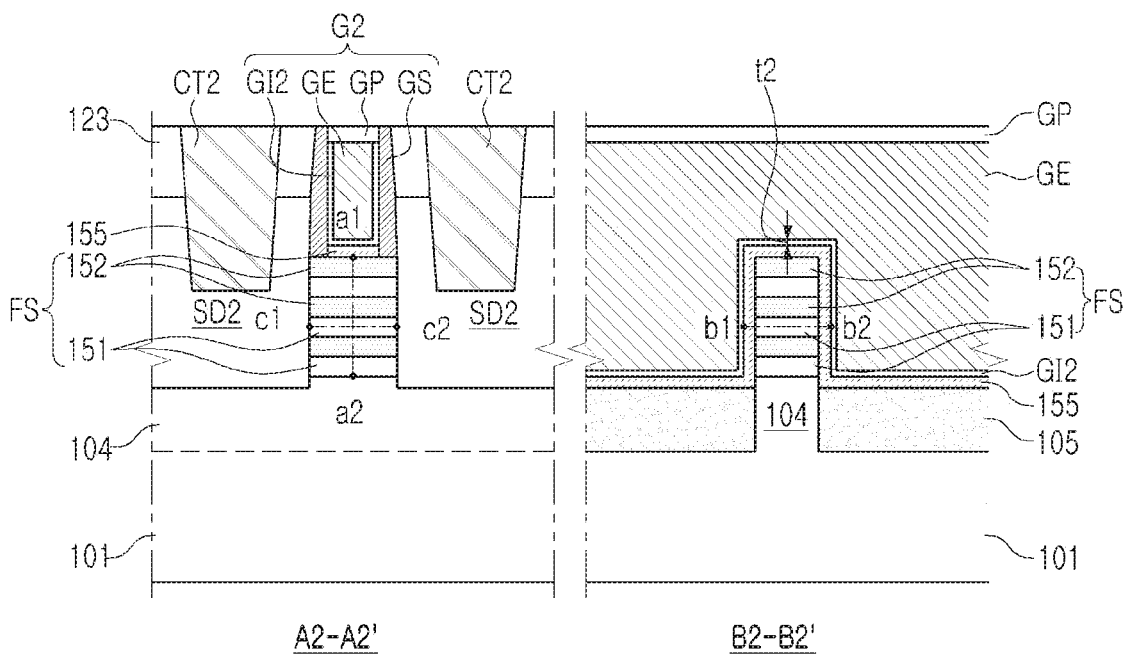
FIG. 2B is a cross-sectional view taken along lines A2-A2' and B2-B2' of FIG. 1.

Referring to FIGS. 1, 2A, and 2B, a semiconductor device 100 according to an example embodiment may include a substrate 101 and first and second transistors TR1 and TR2 respectively disposed in first and second regions I and II of the substrate 101.

The first and second transistors TR1 and TR2 may be formed of first and second active structures ACT1 and ACT2 and first and second gate structures G1 and G2, formed in an active area 104, respectively.

The active area 104 may be provided on the substrate 101. The substrate 101 may be a semiconductor substrate. For example, the substrate 101 may be a silicon substrate or a silicon on insulator (SOI) substrate. The active area 104 may protrude from the substrate 101 in a direction perpendicular to an upper surface of the substrate 101 and may extend in a first direction (e.g., X direction) parallel to the upper surface of the substrate 101. In some embodiments, although the active area 104 is illustrated as one active area, the active area 104 may be provided in a plurality thereof, in parallel in a second direction (e.g., Y direction) crossing the first direction.

An isolation insulating layer 105 may be provided on the substrate 101 on both (e.g., opposite) sides of the active area 104. The isolation insulating layer 105 may extend in the first direction and may have portions that are spaced apart from each other in the second direction with the active area 104 therebetween. The isolation insulating layer 105 may include oxides, nitrides, and/or oxynitrides. In some embodiments, the isolation insulating layer 105 may expose upper sidewalls of the active area 104. The upper surfaces of the isolation insulating layer 105 may be at a level lower than the upper surface of the active area 104 (for example, a height from the substrate 101).

First and second active structures ACT1 and ACT2 may be provided on the active area 104. In a planar view (see FIG. 1), the first and second active structures ACT1 and ACT2 may be provided to overlap the active area 104. The first and second active structures ACT1 and ACT2 may extend in the first direction along the upper surface of the active area 104. The first active structure ACT1 may include a channel layer CH and first source/drain regions SD1 connected (e.g., electrically connected) to both (e.g., opposite) sides of the channel layer CH in the first direction, and the second active structure ACT2 may include a fin structure FS serving as a channel and second source/drain regions SD2 connected (e.g., electrically connected) to both (e.g., opposite) sides of the fin structure FS in the first direction.

The first and second active structures ACT1 and ACT2 may be arranged in the first direction along an upper surface of the active area 104. When a plurality of each of the first and second active structures ACT1 and ACT2 are formed, the first and second active structures ACT1 and ACT2 may be arranged to be spaced apart from each other in the second direction. In addition, when a plurality of active areas 104 are formed, the first and/or second active structures ACT1 and ACT2 may be provided in each of the active areas 104.

Referring to FIG. 2A, cross-sectional views taken along lines A1-A1' and B1-B1' of the first transistor TR1 disposed in the first region I of the substrate 101 are illustrated.

Channel layers CH of the first transistor TR1 may include a plurality of semiconductor patterns spaced apart in a direction perpendicular to the upper surface of the substrate 101 (e.g., Z direction). The semiconductor pattern of the lowermost channel layer CH may be spaced apart from the active area 104 in a direction perpendicular to the upper surface of the substrate 101. The channel layers CH may be disposed between the first source/drain regions SD1, and may be in contact with the first source/drain regions SD1. Each of the first source/drain regions SD1 may be in contact with side surfaces of the channel layers CH. Each of the channel layers CH may connect the first source/drain regions SD1 to each other. Although the number of the channel layers CH is illustrated as three, the present inventive concept is not limited thereto. The channel layers CH may include at least one of silicon (Si), silicon germanium (SiGe), and germanium (Ge).

A first gate structure G1 may be provided on the first active structure ACT1 and may cross the first active structure ACT1. The first gate structure G1 may extend in the second direction to cross the active area 104 and the isolation insulating layer 105. In a planar view, the channel layers CH may overlap the first gate structure G1, and the first source/drain region SD1 may be provided on both (e.g., opposite) sides of the first gate structure G1. In some embodiments, the first gate structure G1 may extend in the second direction to cross the plurality of first active structures ACT1.

The first gate structure G1 may include a gate electrode GE, a first gate insulating film GI1 between the gate electrode GE and the channel layer CH, gate spacers GS on side surfaces of the gate electrode GE, and a gate capping pattern GP on the gate electrode GE. The first gate insulating film GI1 may extend between the gate electrode GE and the gate spacers GS, and an uppermost surface of the first gate insulating film GI1 may be substantially coplanar with the upper surface of the gate electrode GE.

The gate electrode GE may cover the uppermost surface of the channel layers CH, and may cover both side surfaces of the channel layers CH in the second direction. The gate electrode GE may extend in the second direction to cover upper surfaces of the isolation insulating layer 105. The gate electrode GE may fill spaces between the channel layers CH and a space between the lowermost channel layer CH and the active area 104. The first gate insulating film GI1 may be disposed to surround a surface of each of the channel layers CH to be interposed between the channel layers CH and the gate electrode GE, and each of the channel layers CH may be spaced apart from the gate electrode GE with the first gate insulating film GI1 interposed therebetween. The first gate insulating film GI1 may extend along a bottom surface of the gate electrode GE. That is, the first gate insulating film GI1 may be interposed between the gate electrode GE and the isolation insulating layer 105, as well as the gate electrode GE and the active area 104.

As such, in the first transistor TR1 positioned in the first region I of the substrate 101, the gate electrode GE, the channel layer CH, and the first source/drain regions SD1 may constitute a gate-all-around (GAA) type electric field effect transistor.

In contrast, the second transistor TR2 positioned in the second region II of the substrate 101 has a structure different from that of the GAA-type electric field effect transistor.

Referring to FIG. 2B, the second transistor TR2 includes a fin structure FS extending in the first direction (e.g., X direction) on the active area 104. The fin structure FS includes a plurality of first semiconductor patterns 151 and a plurality of second semiconductor patterns 152 that are alternately stacked in a direction perpendicular to the upper surface of the substrate 101 (e.g., Z direction).

The fin structure FS may be disposed between second source/drain regions SD2, and may be in contact with the second source/drain regions SD2. The second source/drain regions SD2 may collectively be in contact with both side surfaces of the fin structure FS in the first direction (e.g., X direction). The fin structure FS, in particular, the second semiconductor patterns 152, may act as a channel. At least each of the second semiconductor patterns 152 may connect the second source/drain regions SD2 to each other. The plurality of second semiconductor patterns 152 may be located at substantially the same level as the plurality of channel layers CH, respectively, and may include the same semiconductor material. The first semiconductor patterns 151 may include a material having etch selectivity with respect to the second semiconductor pattern 152.

The first semiconductor patterns 151 employed in some embodiments may include silicon-germanium (SiGe) having a germanium (Ge) content in a range of 25% to 35%, and the second semiconductor patterns 152 may include SiGe having a relatively low silicon (Si) content or germanium (Ge) content.

Figure 3A:
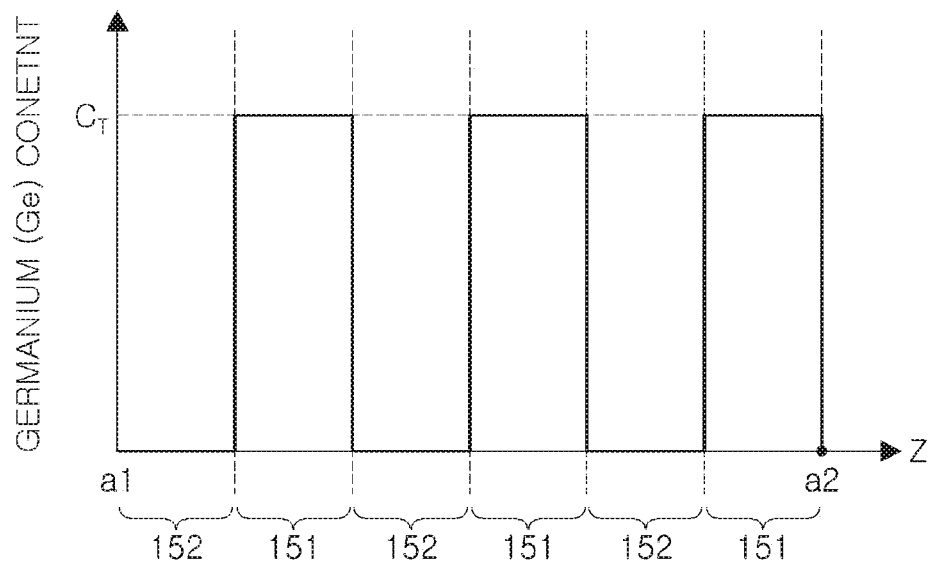
FIGS. 3A and 3B are graphs illustrating Ge content distribution of a fin structure along a thickness direction.

FIG. 3A illustrates Ge content distribution in an a1-a2 section in a staking direction of the fin structure FS illustrated in FIG. 2B, that is, in a direction perpendicular to the upper surface of the substrate (e.g., Z direction).

Referring to FIG. 3A, the Ge content ($C_T$) of the first semiconductor patterns 151 is made of SiGe in a range of 25% to 35%, and the second semiconductor patterns 152 represents content distribution made of Si. Discontinuity of the content distribution is shown at a boundary between the first semiconductor patterns 151 and the second semiconductor patterns 152.

Figure 3B:
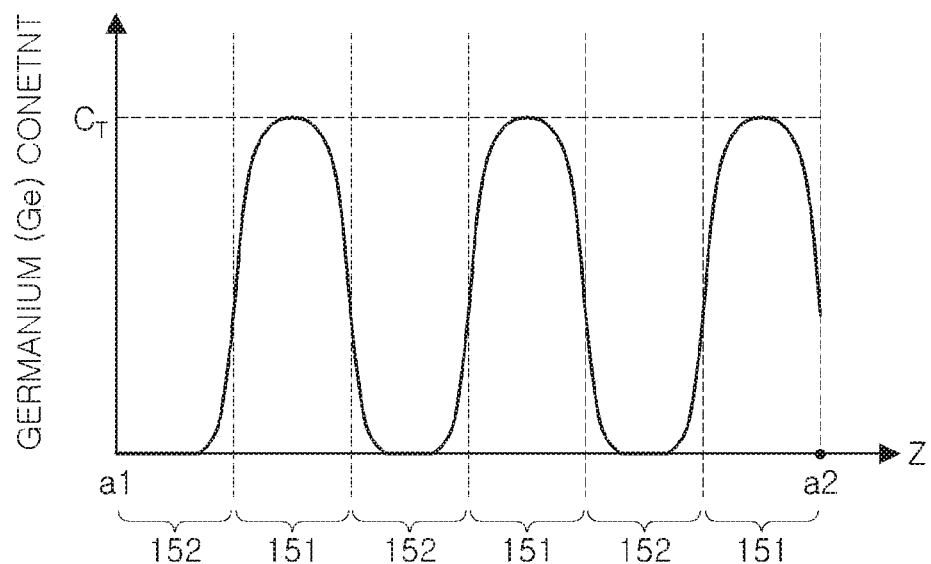

The Ge content distribution may offset the discontinuity in order to prevent performance deterioration due to band gap discontinuity during a process of operating the fin structure FS as a channel. For example, thermal diffusion may be used to impart a gradient to the Ge content distribution in a vertical direction (e.g., Z direction). As illustrated in FIG. 3B, the Ge content distribution may be configured to have a gradient that increases toward the center in the thickness (e.g., vertical) direction in each of the plurality of first semiconductor patterns 151. That is, each of the plurality of first semiconductor patterns 151 has a Ge content gradient that increases toward the center in the thickness direction thereof, and the Ge content $C_T$ may have a range of 25% to 35% in the centers of each of the first semiconductor patterns 151.

A semiconductor cap layer 155 (FIG. 2B) may be disposed to surround the fin structure FS in the second direction (e.g., Y direction). The semiconductor cap layer 155 may be disposed on the upper surface and both side surfaces in the second direction of the fin structure FS, and may extend between the gate electrode GE and the isolation insulating layer 105. The semiconductor cap layer 155 may include silicon (Si).

Figure 4A:
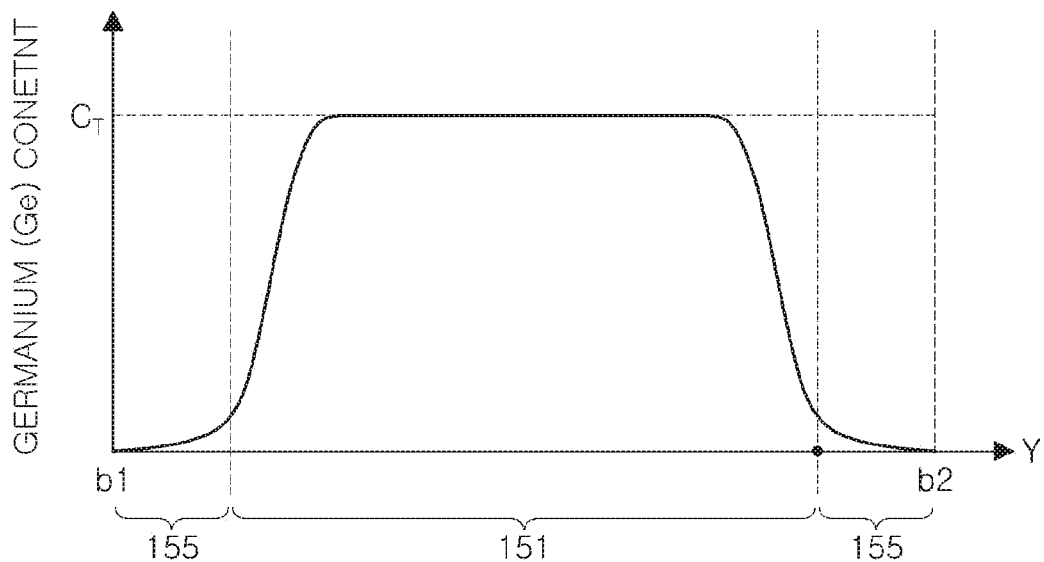
FIGS. 4A and 4B are graphs illustrating Ge content distribution of a fin structure along a width direction.

In a region of the fin structure FS that contacts a plurality of second semiconductor patterns, the content distribution may be changed by thermal diffusion of the Ge element. FIG. 4A illustrates the Ge content distribution in a b1-b2 section of the fin structure FS illustrated in FIG. 2B in the second direction (e.g., Y direction).

As illustrated in FIG. 4A, in each of the plurality of first semiconductor patterns 151, a Ge element is diffused into the semiconductor cap layer 155, made of silicon, and may have a Ge content gradient that increases toward the center in the second direction. Here, the Ge content in the centers of each of the first semiconductor patterns 151 may be in the range of 25% to 35%.

A second gate structure G2 (FIGS. 1 and 2B) may be provided on the second active structure ACT2 and may cross the second active structure ACT2. The second gate structure G2 may extend in the second direction to cross the active area 104 and the isolation insulating layer 105. In a planar view, the fin structure FS may overlap the second gate structure G2, and the second source/drain regions SD2 may collectively be provided on both (e.g., opposite) sides of the second gate structure G2. In some example embodiments, the second gate structure G2 may extend in the second direction to cross the plurality of second active structures ACT2.

The second gate structure G2 may include a gate electrode GE, a second gate insulating film GI2 between the gate electrode GE and the semiconductor cap layer 155, gate spacers GS on side surfaces of the gate electrode GE, and a gate capping pattern GP on the gate electrode GE. The second gate insulating film GI2 may extend between the gate electrode GE and the gate spacers GS, and an uppermost surface of the second gate insulating film GI2 may be substantially coplanar with the upper surface of the gate electrode GE.

In the second transistor TR2, as illustrated in FIG. 2B, the gate electrode GE may cover the upper surface of the fin structure FS and both side surfaces thereof in the second direction. The gate electrode GE may extend in the second direction to cover upper surfaces of the isolation insulating layer 105. The second gate insulating film GI2 may be interposed between the semiconductor cap layer 155 and the gate electrode GE to cover the upper surface of the fin structure FS and both side surfaces of the fin structure FS in the second direction. The second gate insulating film GI2 may extend along a bottom surface of the gate electrode GE.

As described above, the second transistor TR2 positioned in the second region II of the substrate 101 may be an electrical field effect transistor having a structure using the fin structure FS, surrounded by the semiconductor capping layer 155 as a channel, unlike the first transistor TR1 having the GAA type shown in FIG. 2A.

Specifically, the first transistors TR1 may be provided in a first region I of a substrate 101, and the first region I of the substrate 101 may be a memory cell region in which a plurality of memory cells are formed or a logic cell region in which logic transistors are disposed. As an example, the first transistors TR1 may be a portion of memory cell transistors constituting a plurality of SRAM cells. As another example, the first transistors TR1 may be a portion of logic transistors constituting a processor core.

Moreover, the second transistors TR2 may be provided in a second region II of the substrate 101, and the second region II of the substrate 101 may be a peripheral circuit region constituting a power supply circuit.

The second transistor TR2 may be designed to operate at a higher voltage than the first transistor TR1. Therefore, the thickness t2 of the second gate insulating film GI2 may be greater than the thickness t1 of the first gate insulating film GI1. In some embodiments, the second gate insulating film GI2 may have a thickness t2 that is 50% or more greater than the thickness t1 of the first gate insulating film GI1. For example, a thickness t1 of the first gate insulating film GI1 may be 2 nanometers (nm) or less, and a thickness t2 of the second gate insulating film GI2 may be in a range of 3 to 10 nm.

Each gate electrode GE described above may include a doped semiconductor, a conductive metal nitride, and/or a metal. Each gate insulating pattern GI may include at least one of a silicon oxide film, a silicon nitride film, a silicon oxynitride film, or a high dielectric film. For example, the second gate insulating film GI2 may include a silicon oxide film and a silicon nitride film that is on the silicon oxide film. The high dielectric film may include a material having a higher dielectric constant than the silicon oxide film, such as a hafnium oxide film (HfO), an aluminum oxide film (AlO), or a tantalum oxide film (TaO). Each of the gate spacers GS and the gate capping pattern GP may include at least one of a silicon oxide film, a silicon nitride film, and a silicon oxynitride film.

As illustrated in FIG. 1, the first and second transistors TR1 and TR2 are illustrated as different conductivity-type transistors formed in different conductive wells W1 and W2. For example, the first transistor TR1 may be a P-MOSFET formed in an n-type well W1, and the second transistor TR2 may be an N-MOSFET formed in a p-type well W2. However, the present inventive concept is not limited thereto. Accordingly, in some embodiments, the first and second transistors TR1 and TR2 may include the same conductivity-type transistor formed in the same conductive well.

The first and second source/drain regions SD1 and SD2 may be epitaxial layers, selectively grown using the semiconductor layers on a bottom and a side surface of the active area 104 as seed layers. When the first transistor TR1 is a P-MOSFET, the first source/drain regions SD1 may include a material providing compressive strain to the channel layers CH. For example, the first source/drain sources SD1 may include an SiGe layer having a larger lattice constant than Si. The first source/drain regions SD1 may have P-type conductivity. In contrast, when the first transistor TR1 is an N-MOSFET, the first source/drain regions SD1 may include a semiconductor material providing a tensile strain to the channel layers CH. For example, the first source/drain regions SD1 may include an SiC layer having a lattice constant smaller than Si, or an Si layer having substantially the same lattice constant as the substrate 101. The first source/drain regions SD1 may have N-type conductivity.

Meanwhile, the second source/drain region SD2 may have an epitaxial layer that is the same as or similar to that of the first source/drain region SD1. For example, the first and second source/drain regions SD1 and SD2 may include SiGe or silicon phosphide (SiP) epitaxial layers.

Figure 4B:
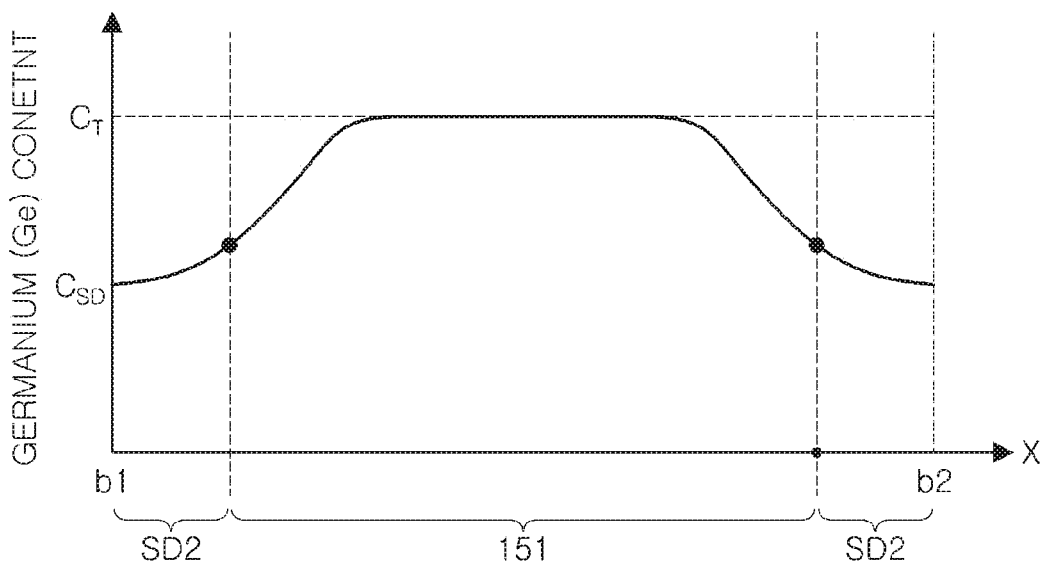

According to the composition of the epitaxial layer constituting the second source/drain region SD2, Ge content distribution in the first direction (e.g., X direction) of the first semiconductor patterns 151 in the second transistor TR2 may vary. FIG. 4B illustrates the Ge content distribution of the b1-b2 cross-section in the cross-section of the second transistor illustrated in FIG. 2B, when the second source/drain region SD2 includes a SiGe epitaxial layer having a relatively low Ge content ($C_{SD}$). Although the Ge content is slightly lower in the adjacent regions of the first semiconductor patterns 151 in contact with the second source/drain region SD2, it can be seen that the Ge content is maintained at a relatively high level (e.g., 25% to 35%) in the internal region of the first semiconductor pattern 151. As mentioned above, the Ge content distribution of the first semiconductor patterns 151 in the first direction (e.g., X direction) may be variously changed according to the composition of the epitaxial layer constituting the second source/drain region SD2.

An interlayer insulating film 123 may be provided on the first and second source/drain regions SD1 and SD2. The gate structure may be located in the interlayer insulating film 123. An upper surface of the interlayer insulating film 123 may be substantially coplanar with an upper surface of the gate capping pattern GP. The interlayer insulating film 123 may include a silicon oxide film or a silicon oxynitride film.

First and second contact plugs CT1 and CT2 (FIG. 1) connected (e.g., electrically connected) to the first and second source/drain regions SD1 and SD2, respectively, may be provided through the interlayer insulating film 123. The first contact plugs CT1 may be in contact with the first source/drain regions SD1, and the second contact plugs CT2 may be in contact with the second source/drain regions SD2. The first and second contact plugs CT1 and CT2 may include a conductive metal nitride and/or a metal. For example, the first and second contact plugs CT1 and CT2 may include a metal nitride such as titanium nitride (TiN), tungsten nitride (WN), or tantalum nitride (TaN) and/or a metal such as Ti, W, or Ta. In some embodiments, a lower surface of a second contact plug CT2 may be in a recess of a second source/drain region SD2 and may be at a level that is lower than an upper surface of an uppermost one of the second semiconductor patterns 152.

Figure 5A:
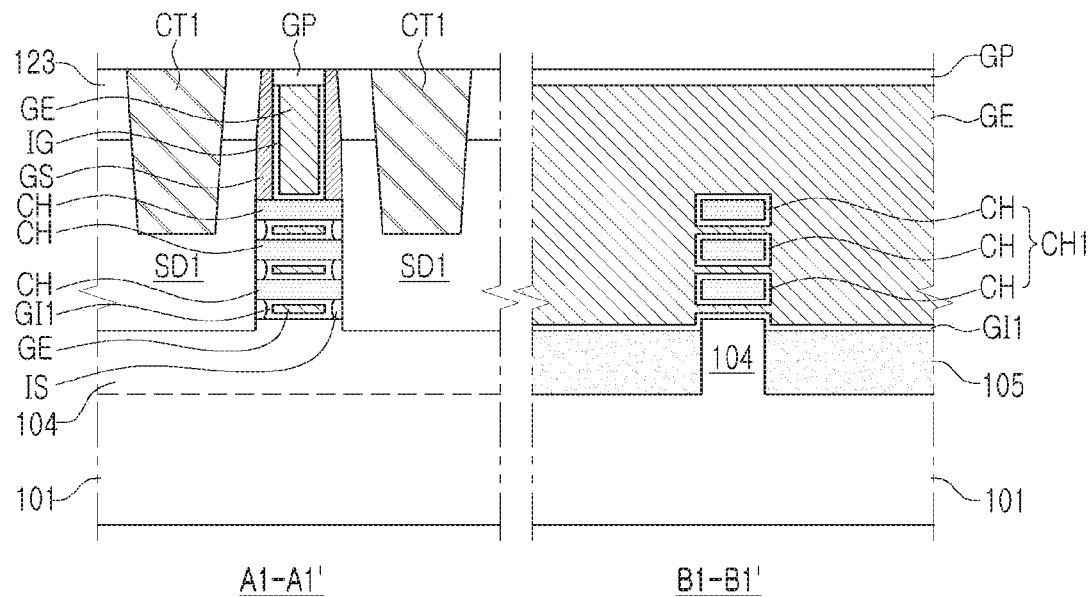
FIGS. 5A and 5B are cross-sectional views of a semiconductor device according to an example embodiment of the present inventive concept.
Figure 5B:
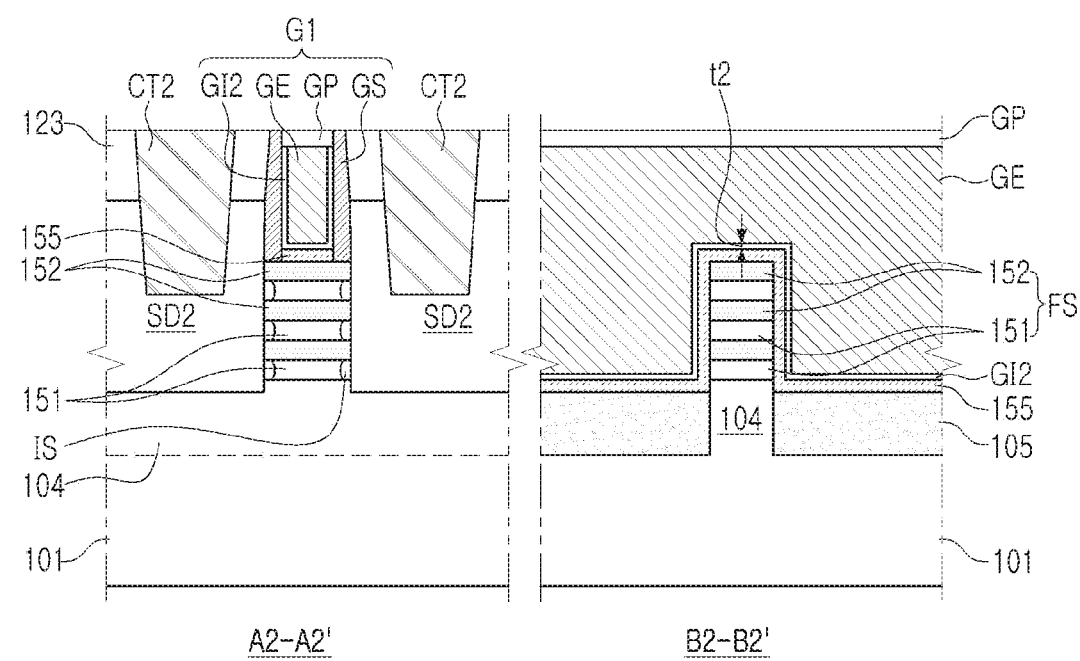

FIGS. 5A and 5B are cross-sectional views of a semiconductor device according to an example embodiment of the present inventive concept.

Referring to FIGS. 5A and 5B, it can be understood that a semiconductor device according to an example embodiment is similar to the semiconductor device 100 illustrated in FIGS. 1, 2A, and 2B except that an internal spacer IS is introduced. Accordingly, the components of FIGS. 5A and 5B may be understood with reference to the descriptions of the same or similar components of the semiconductor device 100 illustrated in FIGS. 1, 2A, and 2B unless specifically stated otherwise.

Unlike the semiconductor device 100 illustrated in FIGS. 1, 2A, and 2B, the first transistor illustrated in FIG. 5A may include internal spacers IS provided between each of the first source/drain regions SD1 and the gate electrode GE. The internal spacers IS may be provided on one side of the gate electrode GE. The internal spacers IS and the channel layers CH may be alternately positioned in the direction perpendicular to the upper surface of the substrate 101. Each of the first source/drain regions SD1 may be in contact with the channel layer CH, and may be spaced apart from the gate electrode GE with the internal spacers IS interposed therebetween. The first gate insulating film GI1 may be interposed between the gate electrode GE and each of the channel layers CH, and may extend between the gate electrode GE and each of the internal spacers IS. The channel layers CH may collectively provide a channel region CH1. Each of the inner spacers IS may be in contact with the first gate insulating film GI1.

Similarly to the first transistor illustrated in FIG. 5A, the second transistor illustrated in FIG. 5B may also include internal spacers IS provided between each of the second source/drain regions SD2 and the first semiconductor patterns 151. Each of the second source/drain regions SD2 is in contact with the second semiconductor patterns 152, but may be spaced apart from the first semiconductor patterns 151 with the internal spacers IS interposed therebetween.

Internal spacers IS of the second transistor (also referred to as "second internal spacers") may be formed in the same process as the internal spacers IS of the first transistor (also referred to as "first internal spacers"). The internal spacer layers of the first and second transistors may include the same insulating material.

In some example embodiments, after the recess formation for the source/drain (see FIG. 10) and before the epitaxial growth for the source/drain (see FIG. 11), the first semiconductor pattern 151 may be formed by partially selectively etching the first semiconductor pattern 151 and filling an insulating material, or the like, in the etched portion.

As such, internal spacers IS may be disposed on both (e.g., opposite) sides of the gate electrode GE in the first direction between a plurality of channel layers CH, and internal spacers IS may be disposed on both (e.g., opposite) sides of the plurality of first semiconductor patterns 151 in the first direction between the plurality of second semiconductor patterns 152. For example, the internal spacers IS may include silicon nitride (SiN), silicon carbonitride (SiCN), silicon oxynitride (SiON), silicon boron nitride (SiBN), silicon oxycarbonitride (SiOCN), silicon boron carbonitride (SiBCN) and/or silicon oxycarbide (SiOC).

Hereinafter, a manufacturing method of a semiconductor device according to an example embodiment of the present inventive concept will be described with reference to the accompanying drawings.

FIGS. 6 to 11 are perspective views illustrating a main process of a manufacturing method of a semiconductor device according to an example embodiment of the present inventive concept, particularly a process of forming a fin structure and a dummy gate structure. For convenience of description, the process will be described by dividing the process into a main process centering on the manufacturing process of the first transistor TR1 and the second transistor TR2.

Figure 6:
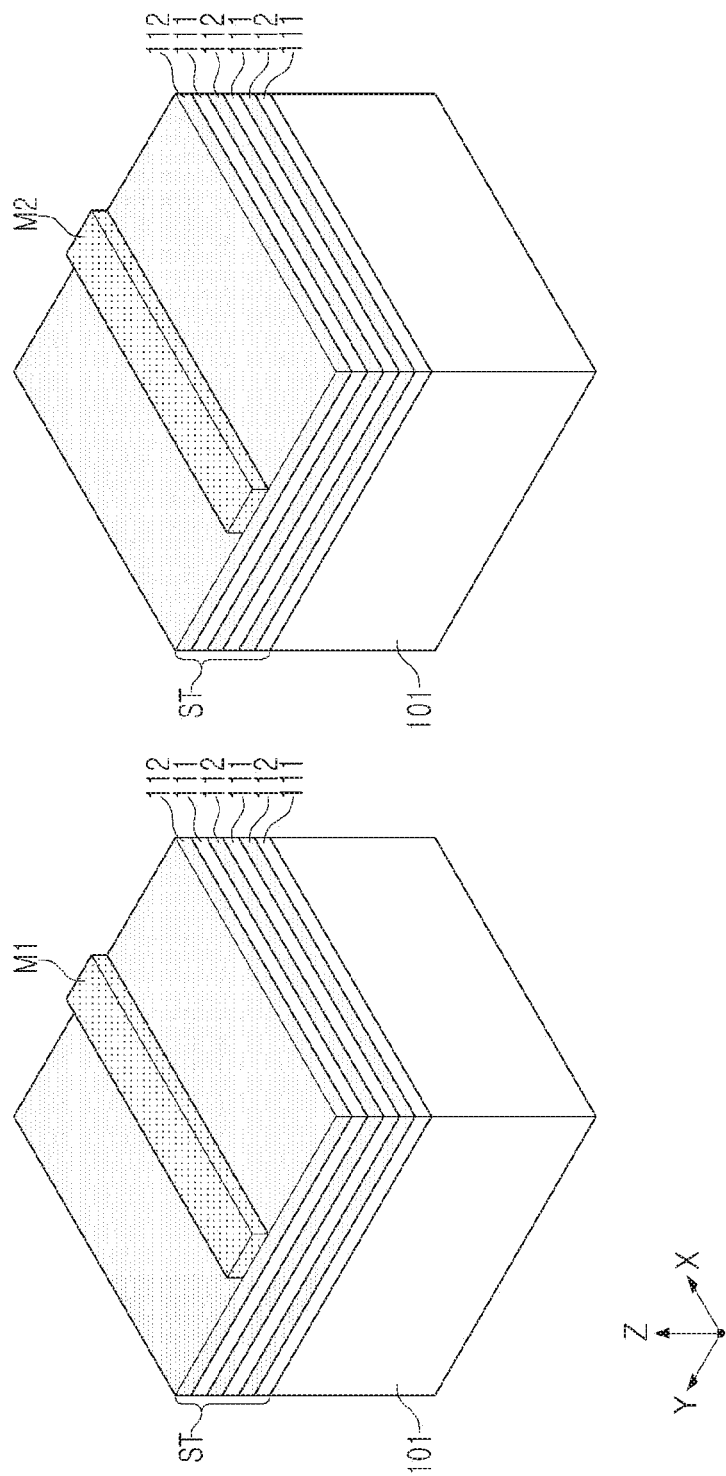
FIGS. 6 to 11 are perspective views illustrating a main process of a method of manufacturing a semiconductor device according to an example embodiment of the present inventive concept.

Referring to FIG. 6, a stacked structure ST in which the first semiconductor layer 111 and the second semiconductor layer 112 are alternately stacked is formed on a substrate 101.

The substrate 101 may include a first region I and a second region II. For example, the first region I may be a memory cell or a logic region, and the second region II may be a peripheral circuit region such as a power supply circuit. Second semiconductor layers 112 and first semiconductor layers 111 may be alternately formed on the first semiconductor layer 111 that is in contact with the substrate 101. An uppermost layer of the stacked structure ST may be the second semiconductor layer 112, but is not limited thereto. The first semiconductor layers 111 and the second semiconductor layers 112 may be formed using, for example, an epitaxial growth method, but are not limited thereto.

The first semiconductor layers 111 and the second semiconductor layers 112 may each include a material having different etch selectivity. For example, in the first region I, the first semiconductor layers 111 may be used as sacrificial layers for forming gate electrodes, and the second semiconductor layers 112 may be used as channel layers. In this case, even when the first semiconductor layers 111 are etched, the semiconductor layers 112 may remain with little etching. The first semiconductor layers 111 may include SiGe, such as SiGe having a Ge content of 25 to 35%. The second semiconductor layers 112 may include, for example, one of Si or a group compound semiconductor.

Subsequently, first and second mask patterns M1 and M2 extending in a first direction (e.g., an X direction) are formed on the stacked structure ST. The first and second mask patterns M1 and M2 may be formed of at least one material of a silicon oxide film, a silicon nitride film, and a silicon oxynitride film.

Figure 7:
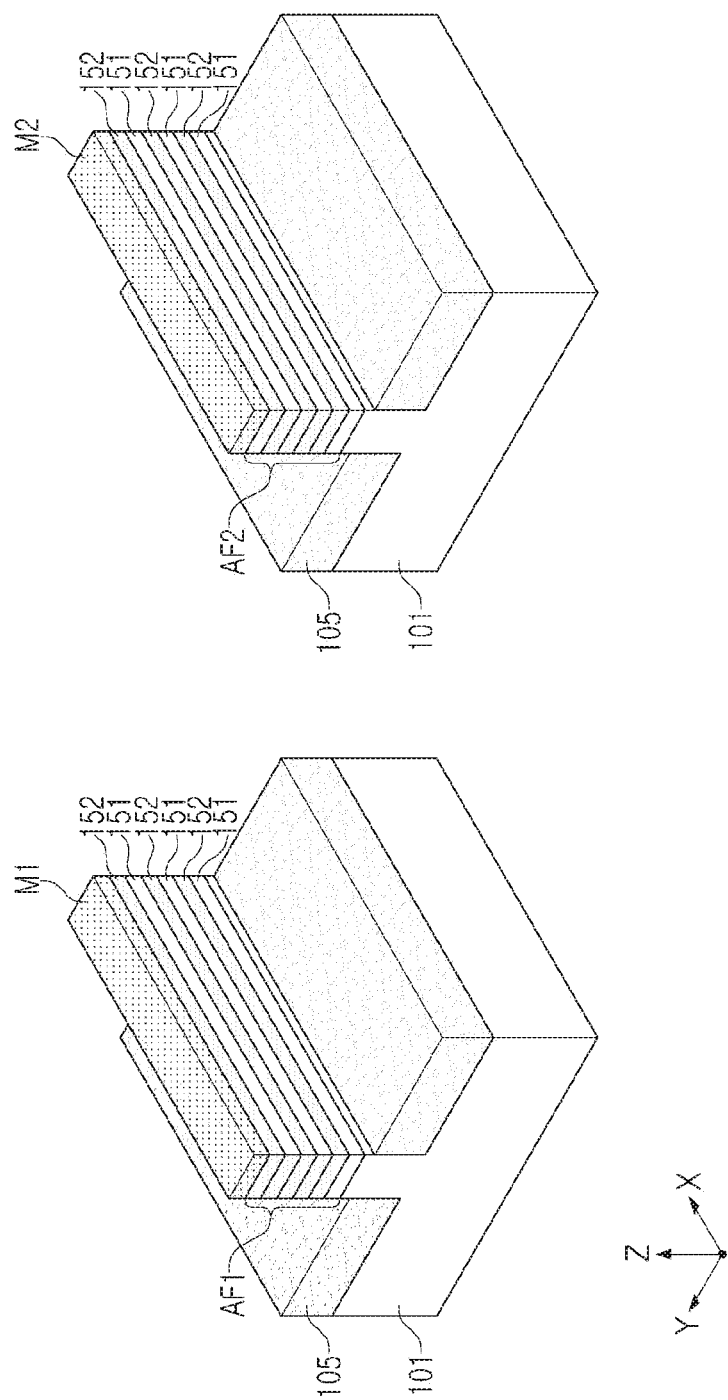

Next, referring to FIG. 7, a stacked structure ST may be etched using the first mask pattern M1 and the second mask pattern M2 as masks, respectively, to form a first fin structure AF1 and a second fin structure AF2.

In an example embodiment, a protruding portion 104 corresponding to the first fin structure AF1 and the second fin structure AF2 may be formed by etching up to a portion of the upper surface of the substrate 101, and an isolation insulating layer 105 may be formed around the protruding portion 104. The isolation insulating layer 105 may partially cover a side surface of the protruding portion 104. An upper surface of the isolation insulating layer 105 may be formed to be lower than an upper surface of the protruding portion 104 on the substrate 101. That is, the protruding portion 104 on the substrate 101 may protrude higher than the isolation insulating layer 105. The first and second fin structures AF1 and AF2 may include the first semiconductor patterns 151 and the second semiconductor patterns 152 that are alternately stacked in the first region I and the second region II of the substrate 101, respectively.

Subsequently, referring to FIG. 8, a semiconductor cap layer 155 may be formed on the second fin structure AF2, and an etch stop layer 131 and a dummy gate layer may be sequentially formed on the first fin structure AF1 and the second fin structure AF2. Subsequently, an etching process is performed using third and fourth mask patterns M3 and M4 to form first and second dummy gate electrodes DG1 and DG2.

The first and second dummy gate electrodes DG1 and DG2 may cross portions of the first and second fin structures AF1 and AF2 to form first and second dummy gate electrodes DG1 and DG2 extending in a second direction Y. In the present etching process, the semiconductor cap layer 155 and the etch stop layer 131 may also be patterned together with the first and second dummy gate electrodes DG1 and DG2.

Figure 8:
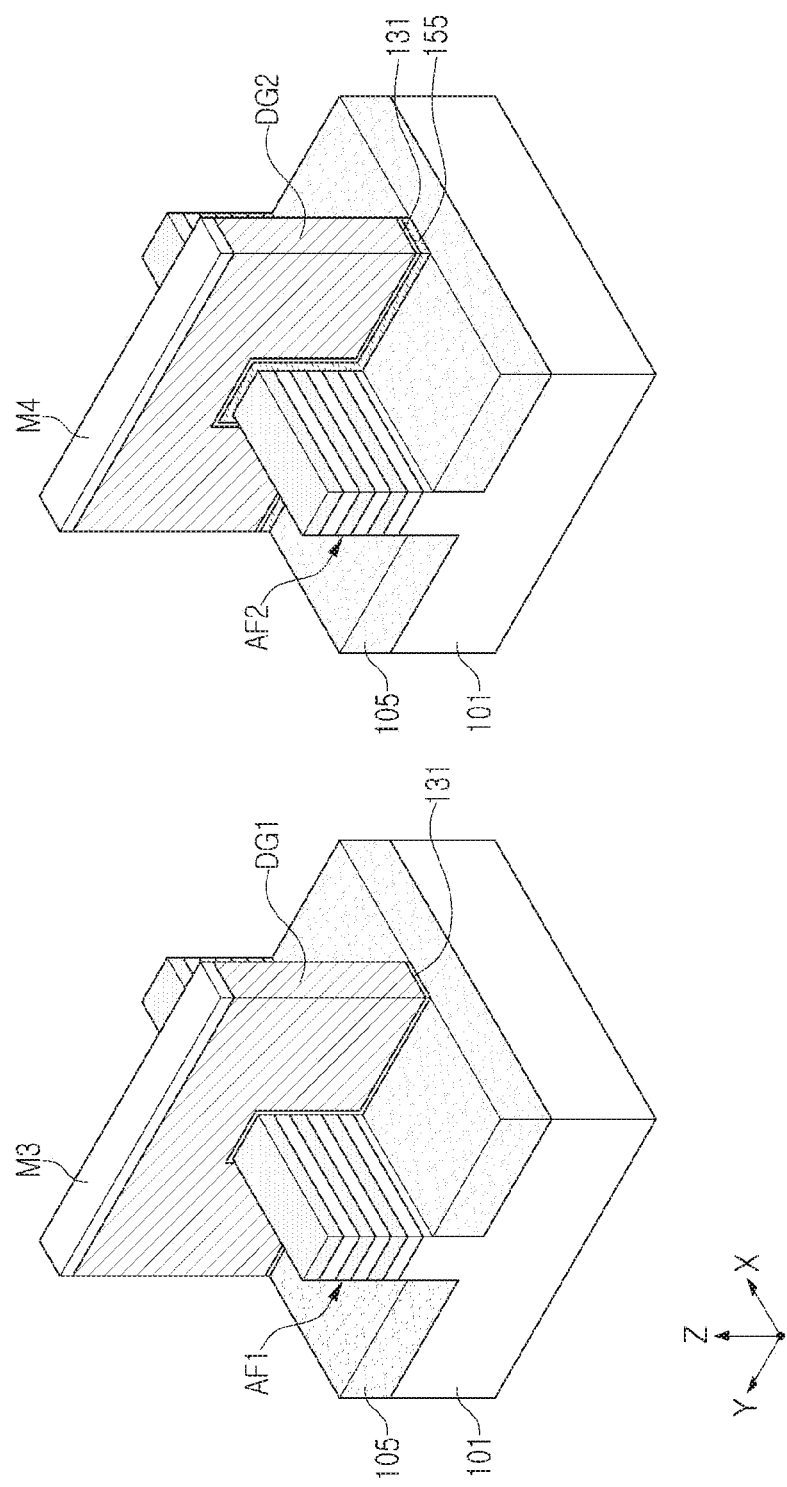

As illustrated in FIG. 8, a lower portion of the second dummy gate electrode DG2 includes a semiconductor cap layer 155 crossing a portion of the second fin structure AF2. The semiconductor cap layer 155 may be disposed to be in direct contact with an upper surface of the portion of the second fin structure AF2 and both (e.g., opposite) side surfaces thereof in the second direction. The semiconductor cap layer 155 may be formed of the same material as the second semiconductor patterns 152. For example, the semiconductor cap layer 155 may include silicon (Si). For example, the first dummy gate electrode DG1 and the second dummy gate electrode DG2 may be one of polysilicon or amorphous silicon, respectively. For example, the etch stop layer 131 may be formed of at least one layer selected from a silicon oxide, a silicon nitride, and a silicon oxynitride.

Figure 9:
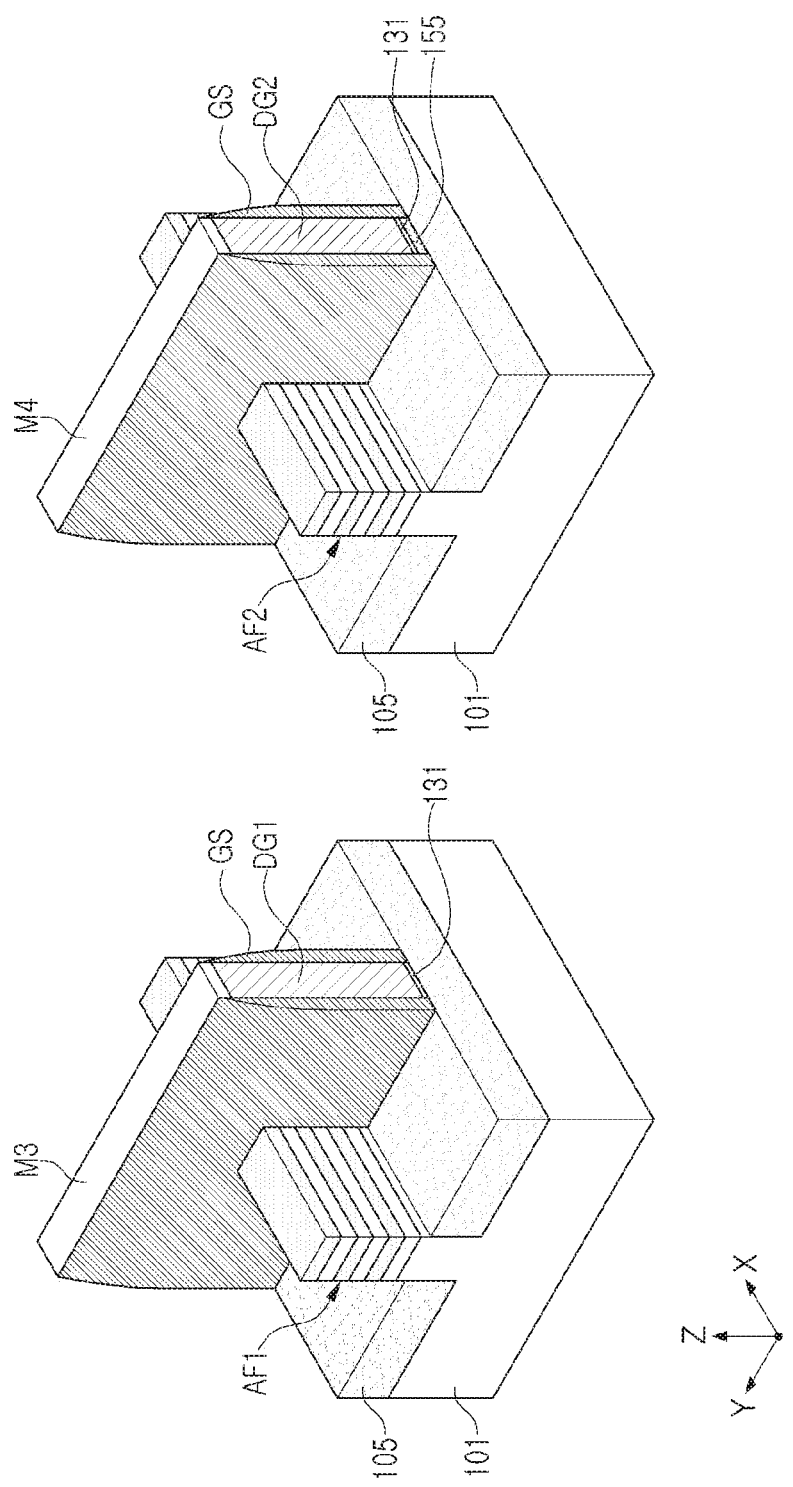

Next, referring to FIG. 9, a gate spacer GS may be formed on sidewalls of the first dummy gate electrode DG1 and the second dummy gate electrode DG2.

Specifically, a spacer film covering the first dummy gate electrode DG1, the second dummy gate electrode DG2, the first fin structure AF1, and the second fin structure AF2 is formed on the substrate 101. Subsequently, the spacer film may be etched back to form a gate spacer GS remaining on the sidewall of the first dummy gate electrode DG1 and the side wall of the second dummy gate electrode DG2.

The gate spacer GS may include at least one, for example, of silicon nitride (SiN), silicon oxynitride (SiON), silicon oxide (SiO$_2$), silicon oxycarbonitride (SiOCN), and combinations thereof. In FIG. 9, the gate spacers GS are illustrated as a single layer, but the present inventive concept is not limited thereto, and may have a multilayer structure.

Figure 10:
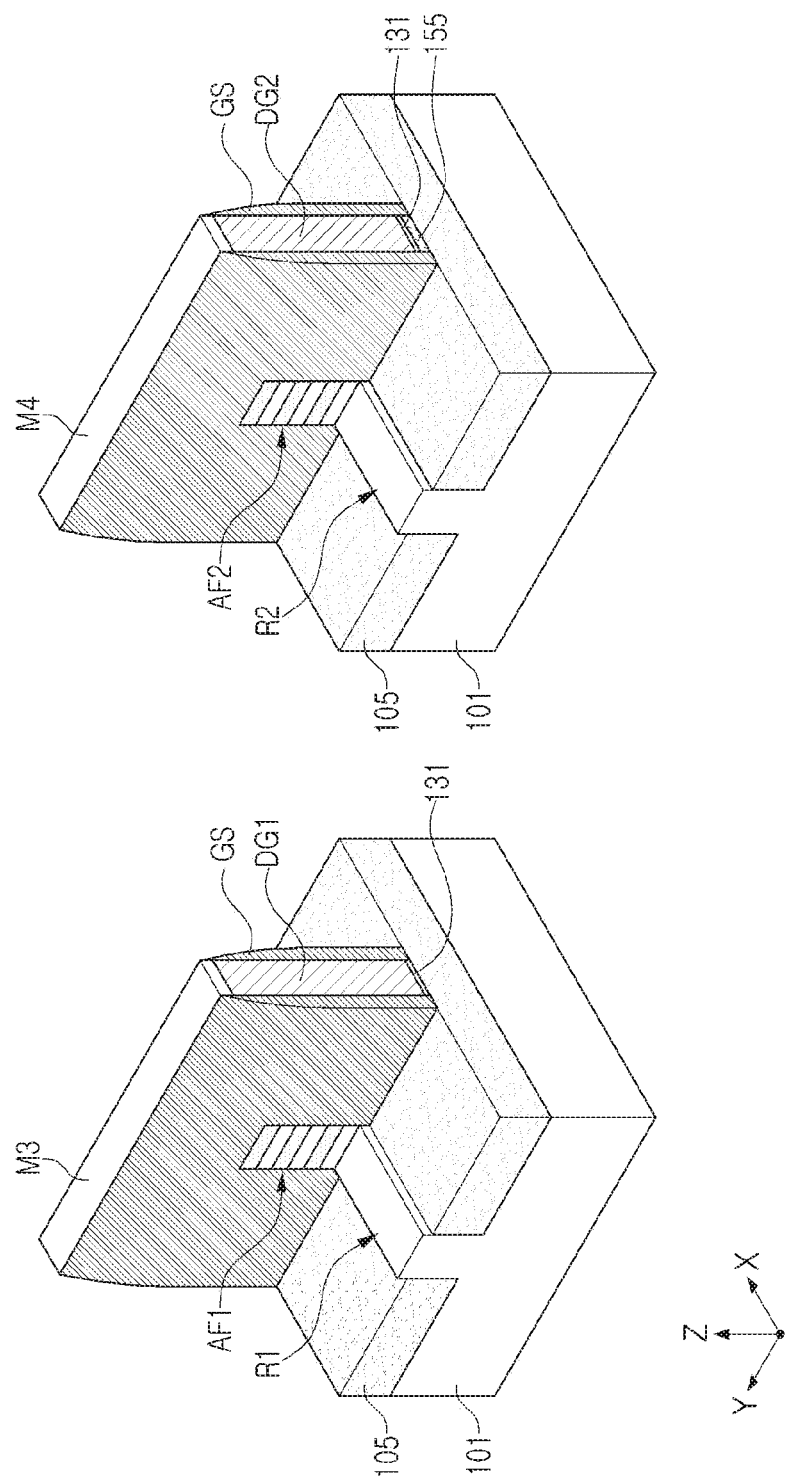

Subsequently, referring to FIG. 10, portions of the first fin structure AF1 exposed to both (e.g., opposite) sides of the first dummy gate electrode DG1 and the gate spacer GS are removed to form a first recess R1 in the first fin structure AF1. Similarly, portions of the second fin structure AF2 exposed to both (e.g., opposite) sides of the second dummy gate electrode DG2 and the gate spacer GS are removed to form a second recess R2 in the second fin structure AF2.

In some embodiments, the first recess R1 formation process and the second recess R2 formation process may be simultaneously performed. While forming the first and second recesses R1 and R2, a portion of the active area 104 in contact with the substrate 101 may be left to be used as an epitaxial seed, but is not limited thereto. The first semiconductor patterns 151 and the second semiconductor patterns 152 that are alternately stacked may be exposed through side surfaces of the first and second recesses R1 and R2. If necessary, an optional etching process for forming internal spacers may be further performed. For example, in the case of the second transistor TR2, after forming a recess and before forming the first and second source/drain regions SD1 and SD2, it may be selectively partially etched on the side surfaces of the first semiconductor patterns 151, and internal spacers IS may be formed in the etched space.

Figure 11:
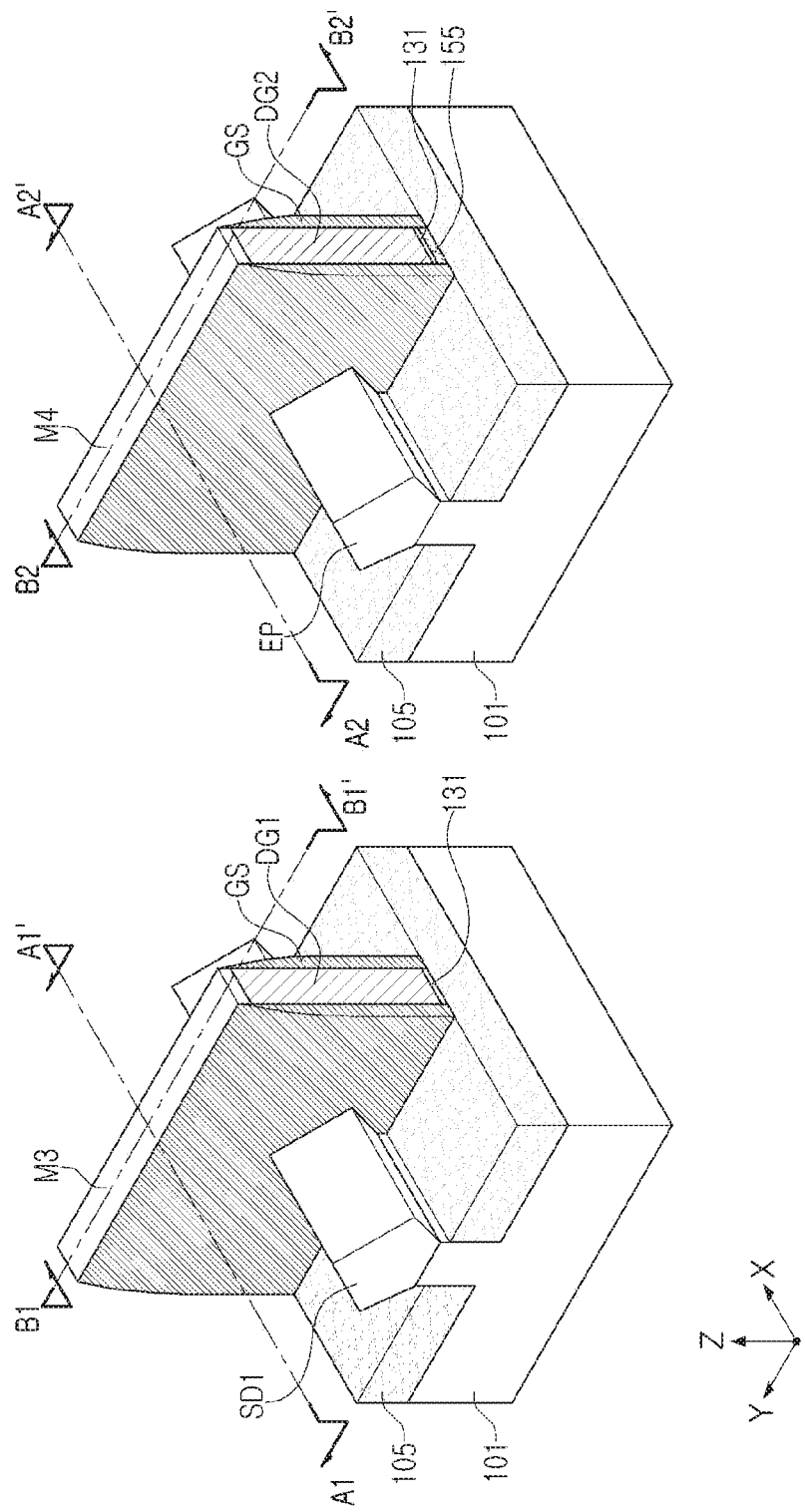

Next, referring to FIG. 11, an epitaxial growth process may be performed on the first and second fin structures AF1 and AF2 to fill the first and second recesses R1 and R2. The epitaxial growth process for the first and second recesses R1 and R2 may be simultaneously performed with a single process.

Epitaxial growth on both sides of the first and second dummy gate electrodes DG1 and DG2 may provide the first and second source/drain regions SD1 and SD2. The epitaxial growth process may be performed using the surface of the semiconductor exposed to bottom surfaces of the first and second recesses R1 and R2 and the first semiconductor patterns 151 and the second semiconductor patterns 152 exposed to side surfaces of the first and second recesses R1 and R2 as seed layers. The first and second source/drain regions SD1 and SD2 may have various shapes defined as crystallographically stable surfaces during the growth process. For example, the first and second source/drain regions SD1 and SD2 may have a pentagonal cross-section. Meanwhile, when the first and second source/drain regions SD1 and SD2 include silicon (Si) and/or silicon carbide (SiC) doped with n-type impurities, the cross-sections of the first and second source/drain regions SD1 and SD2 may be hexagonal or polygonal with a gentle angle.

Hereinafter, a process of forming a gate structure of a method of manufacturing a semiconductor device according to an example embodiment will be described with reference to FIGS. 12A to 15B.

Specifically, FIGS. 12A, 13A, 14A, and 15A are cross-sectional views taken along lines A1-A1' and A2-A2' of each main process, and FIGS. 12B, 13B, 14B, and 15B are cross-sectional views taken along lines B1-B1' and B2-B2' of each main process.

Figure 12A:
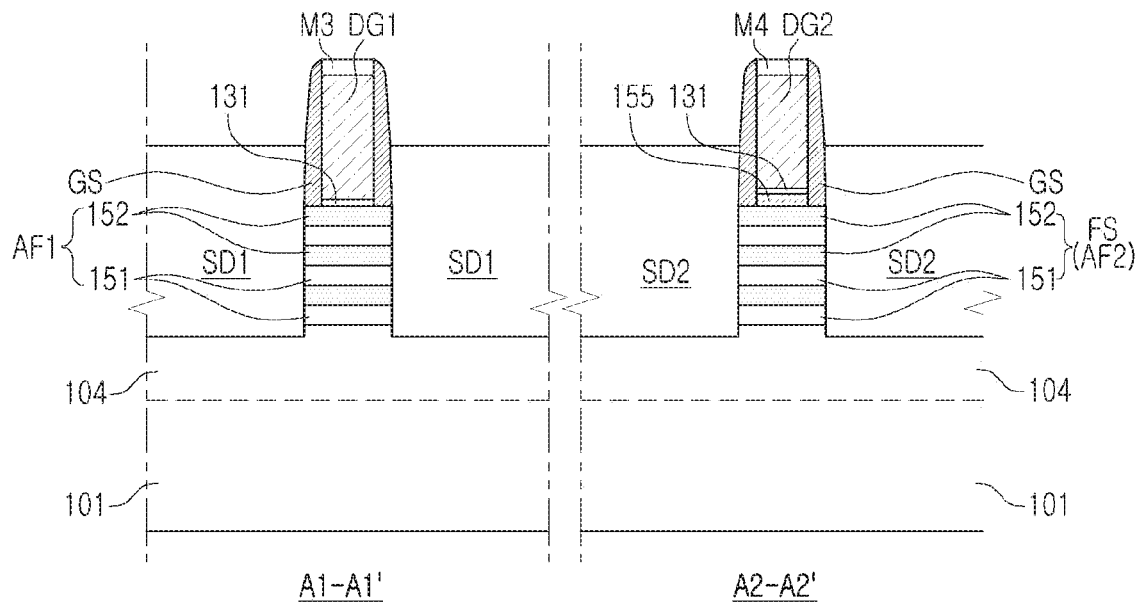
FIGS. 12A, 13A, 14A, and 15A are cross-sectional views (A1-A1', A2-A2') illustrating a process of forming a gate structure of a method of manufacturing a semiconductor device according to an example embodiment of the present inventive concept.
Figure 12B:
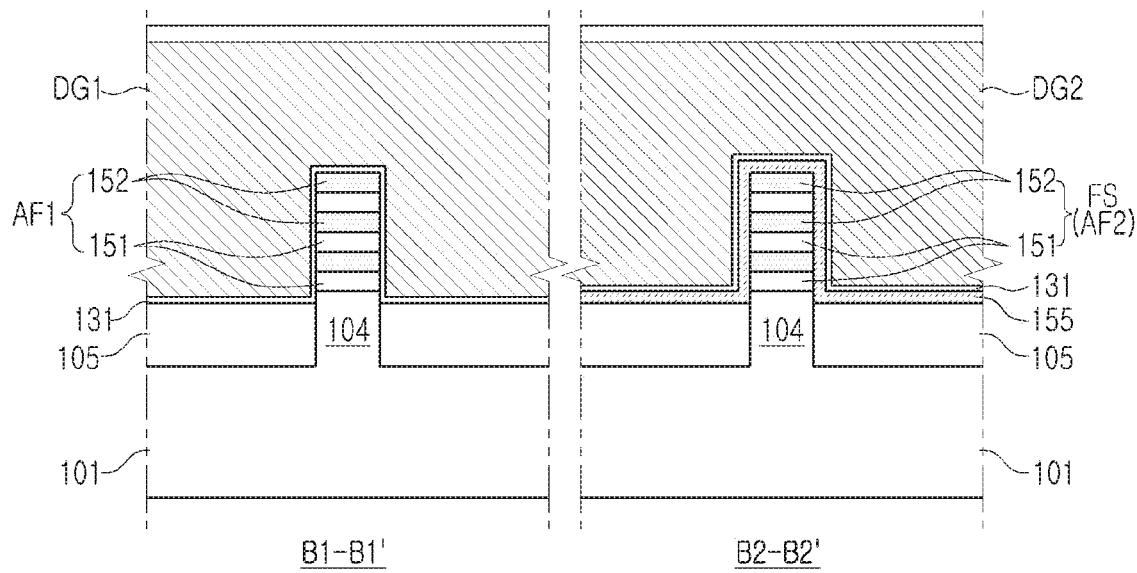
FIGS. 12B, 13B, 14B, and 15B are cross-sectional views (B1-B1', B2-B2') illustrating a process of forming a gate structure of a method of manufacturing a semiconductor device according to an example embodiment of the present inventive concept.

FIGS. 12A and 12B illustrate cross-sections taken along lines A1-A1' and A2-A2' and cross-sections taken along lines B1-B1' and B2-B2' for the portions illustrated in FIG. 11.

Referring to FIGS. 12A and 12B, the first source/drain regions SD1 are in contact with a side surface of the first fin structure AF1 located in lower portions of the first dummy gate electrode DG1 and the gate spacer GS, that is, with the first semiconductor pattern 151 and the second semiconductor pattern 152. Similarly, the second source/drain regions SD2 are in contact with the second fin structure AF2 disposed in a lower portion of the second dummy gate electrode DG2 and the gate spacer GS.

Meanwhile, referring to FIG. 12B, the etch stop layer 131 may be in direct contact with the first fin structure AF1, but the semiconductor cap layer 155 may be formed to be in direct contact with the second fin structure AF2, and the etch stop layer 131 may be disposed on the semiconductor cap layer 155.

Figure 13A:
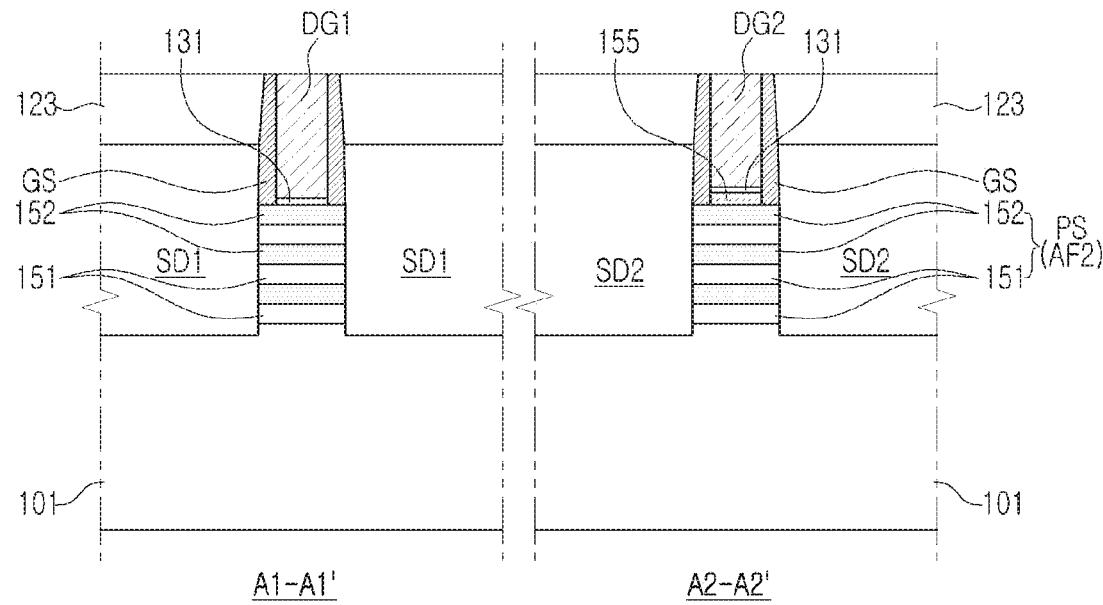
Figure 13B:
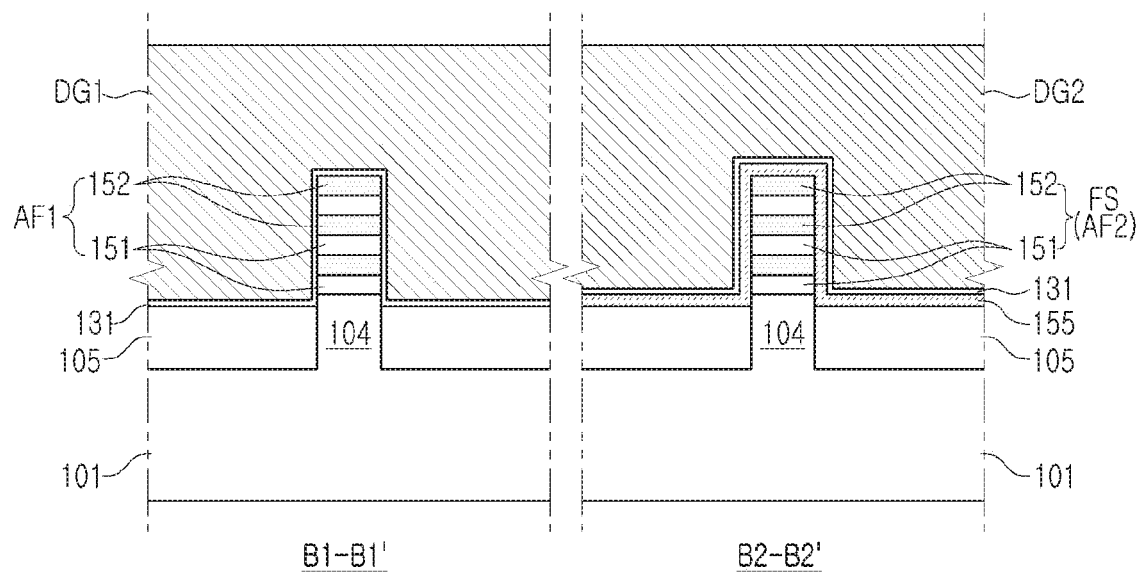

Subsequently, referring to FIGS. 13A and 13B, an interlayer insulating film 123 may be formed to cover the first and second source/drain regions SD1 and SD2, the first and second dummy gate electrodes DG1 and DG2, and the gate spacer GS, and subsequently, the interlayer insulating film 123 may be planarized until the first dummy gate electrode DG1 and the second dummy gate electrode DG2 are exposed.

In the present planarization process, the third mask patterns M3 and the fourth mask pattern M4 may be removed. The interlayer insulating film 123 may include at least one of a low dielectric material, an oxide film, a nitride film, and an oxynitride film. The low dielectric constant material, may include, for example, Flexible Oxide (FOX), Tonen SilaZene (TOSZ), Undoped Silica Glass (USG), Borosilica Glass (BSG), PhosphoSilaca Glass (PSG), BoroPhosphoSilica Glass (BPSG), Plasma Enhanced Tetra Ethyl Ortho Silicate (PETEOS), Fluoride Silicate Glass (FSG), High Density Plasma (HDP) oxide, Plasma Enhanced Oxide (PEOX), Flowable CVD (FCVD) oxide, or a combination thereof.

Figure 14A:
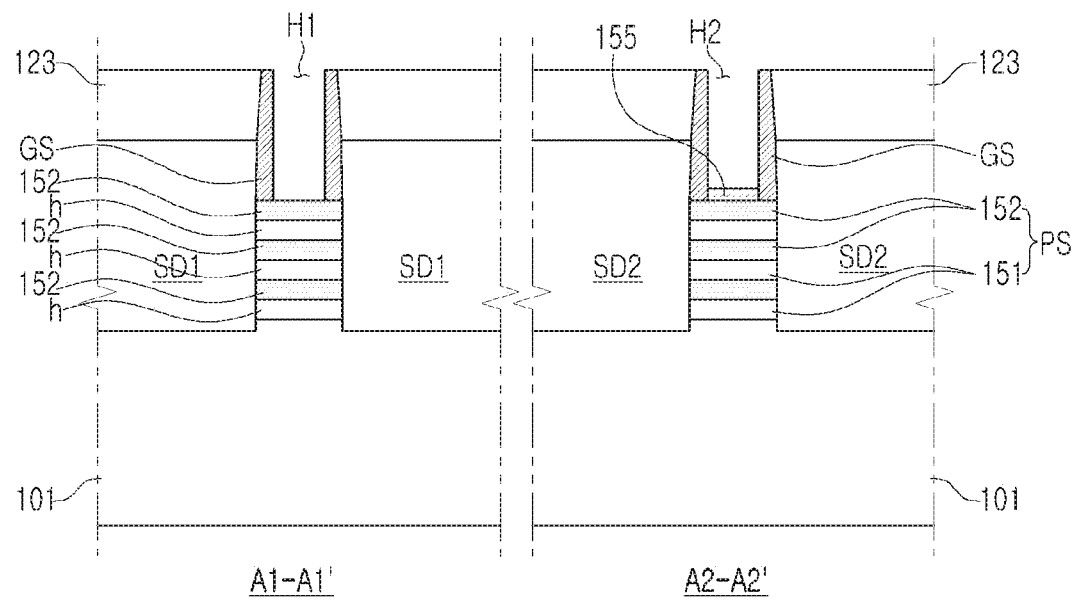
Figure 14B:
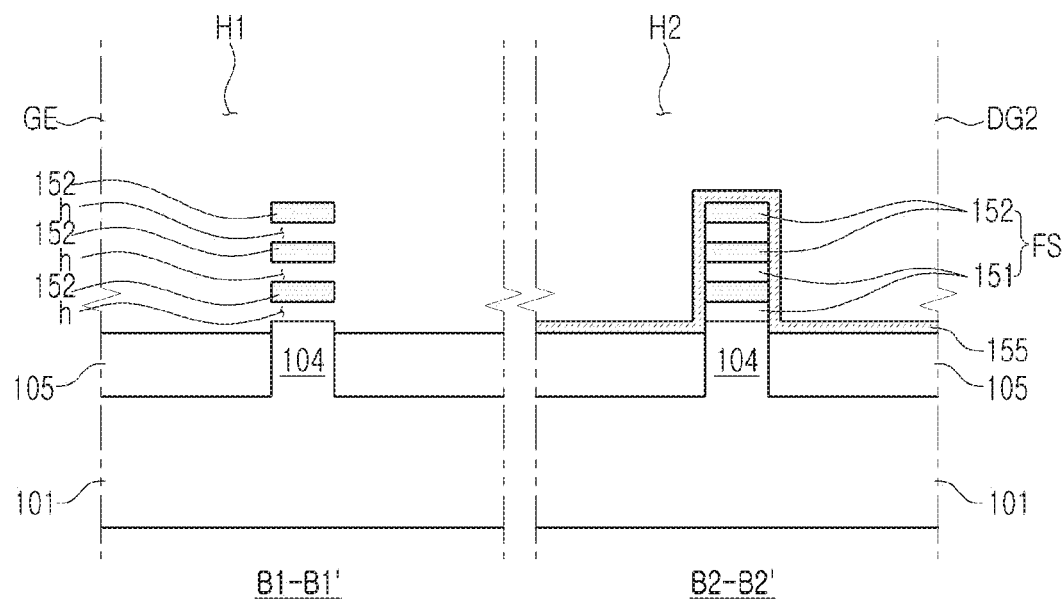

Next, referring to FIGS. 14A and 14B, the first dummy gate electrode DG1 and the second dummy gate electrode DG2 may be removed, and the etch stop layer 131 may be selectively removed through the exposed regions. Subsequently, a selective etching process on the second semiconductor patterns 152 is performed.

According to the present process, as illustrated in FIG. 14A, first and second open regions H1 and H2 may be formed between the gate spacers GS. While side surfaces of the first semiconductor patterns 151 and the second semiconductor patterns 152 of the first fin structure AF1 are exposed through the first open region H1 in a second direction, since the second fin structure AF2 is still covered by the semiconductor cap layer 155 in the second open region H2, the second semiconductor patterns 152 of the second fin structure AF2 may not be exposed.

In the first region I, the first semiconductor pattern 151 may be removed using an etchant having a higher etching rate for the first semiconductor patterns 151 than an etching rate for the second semiconductor patterns 152. A plurality of spaces h respectively corresponding to the first semiconductor patterns 151 may be formed. As a result, in the first region I, the second semiconductor patterns 152 may provide the channel layers CH by connecting the first source/drain regions SD1 in the first direction.

Alternatively, even when the same etching process is applied to the second region II, the first semiconductor patterns 151 are not exposed by the semiconductor cap layer 155, so that the structure of the second fin structure AF2 may remain as it is.

Figure 15A:
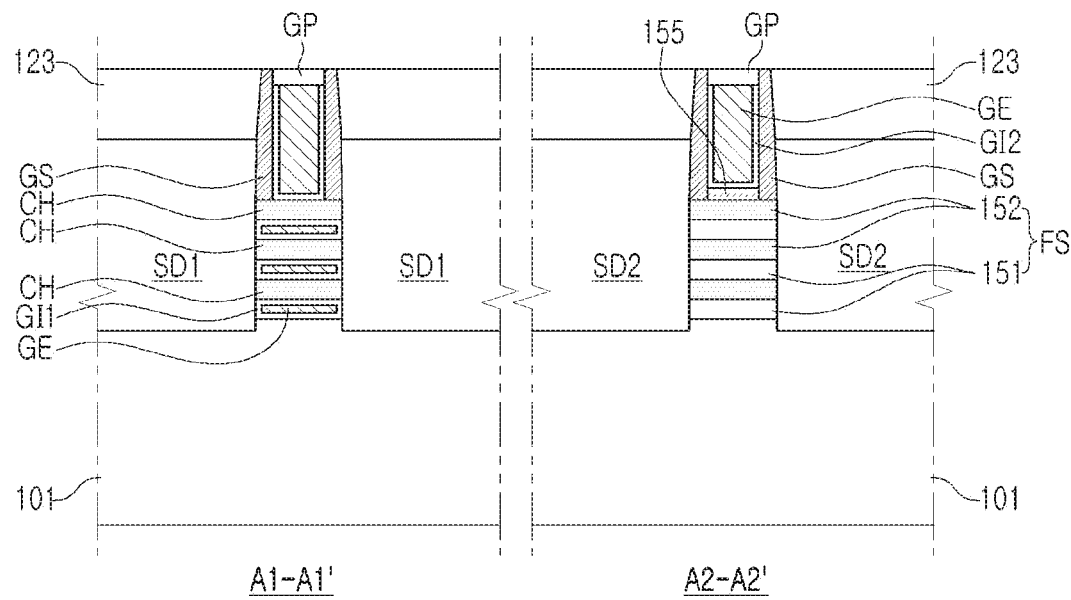
Figure 15B:
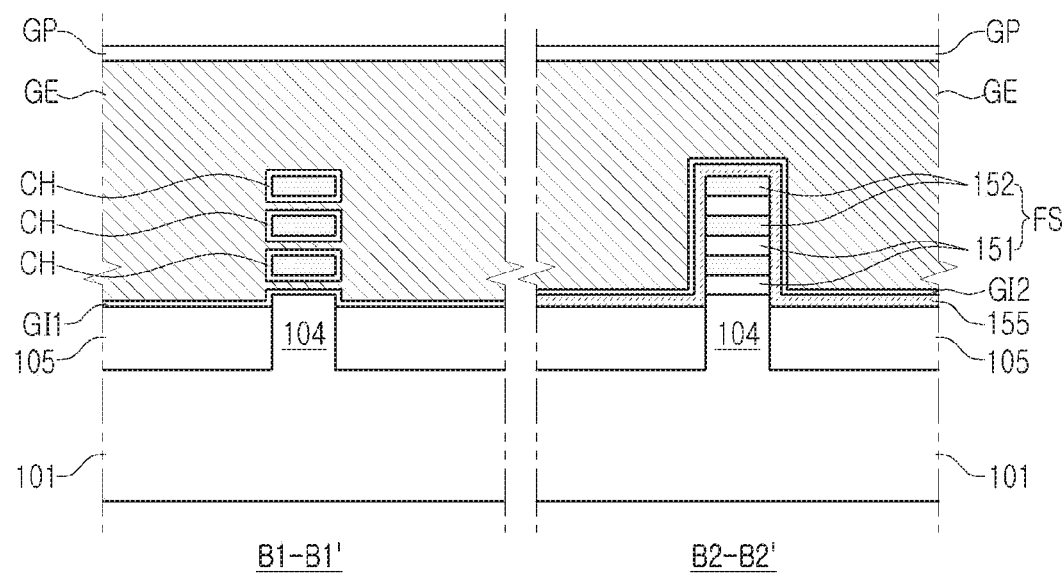

Next, referring to FIGS. 15A and 15B, a first gate insulating film GI1 may be formed along a circumference of the second semiconductor patterns 152 and a sidewall of the gate spacer GS, and the exposed first source/drain regions SD1 in the first region I. In addition, a second gate insulating film GI2 may be formed on the surface of the second fin structure AF2, that is, the upper surface of the semiconductor cap layer 155 and the sidewall of the gate spacer GS in the second region II.

The first and second gate insulating films GI1 and GI2 may be conformally formed, and may be formed by another insulating film forming process. As described above, the thickness of the second gate insulating film GI2 may be greater than the thickness of the first gate insulating film GI1.

Subsequently, the gate electrode GE may be formed on the first and second gate insulating films GI1 and GI2 to extend in the second direction Y. Specifically, in the first region I, the gate electrode GE may be formed in a space between the gate spacers GS, a space between the channel layers CH, and a space between the lowermost channel layer CH and the active area 104.

On the other hand, in the second region II, the gate electrode GE may be formed between the side walls of the gate spacer GS. The gate electrode GE may be disposed between the second gate insulating films GI2, and on the upper surface of the fin structure FS, and may extend along the side surfaces thereof in the second direction.

Figure 16:
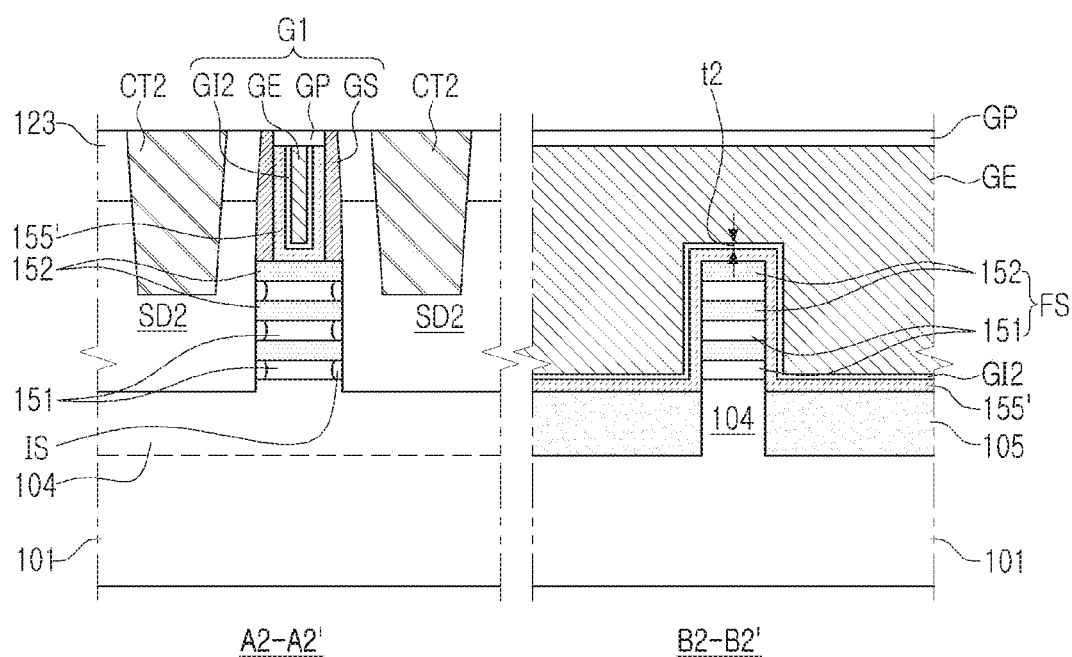
FIG. 16 is a cross-sectional view illustrating a semiconductor device according to an example embodiment of the present inventive concept.

FIG. 16 illustrates a cross-sectional view of a semiconductor device according to an example embodiment of the present inventive concept.

Referring to FIG. 16, it may be understood that the semiconductor device according to an example embodiment is similar to the semiconductor device (particularly, second transistor) illustrated in FIG. 5B, except that a structure of a semiconductor cap layer 155' is different. Accordingly, the components shown in FIG. 16 may be understood with reference to the descriptions of the same or similar components of the semiconductor device (particularly, the second transistor) illustrated in FIGS. 2B and 5B unless otherwise stated.

Gate spacers GS may be disposed on both side surfaces of the gate electrode GE in the first direction. The semiconductor cap layer 155' employed in some embodiments may extend along inner side surfaces of the gate spacers GS, as well as an upper surface and both side surfaces of the fin structure FS. Unlike the semiconductor device illustrated in FIG. 5B, the semiconductor cap layer 155 is not introduced before forming the dummy gate electrode DG2, and may be understood as a result formed after the dummy gate electrode DG2 and the etch stop layer 131 are removed.

As set forth above, according to example embodiments of the present inventive concept, a semiconductor device having a channel of a three-dimensional structure with improved electrical characteristics may be provided.

Though example embodiments have been shown and described above, it will be apparent to those skilled in the art that modifications and variations can be made without departing from the scope of the present inventive concept as defined by the appended claims.

What is claimed:
1. A semiconductor device comprising:
a substrate;
a fin structure having a plurality of first semiconductor patterns and a plurality of second semiconductor patterns, alternately stacked on the substrate, and extending in a first direction;
a semiconductor cap layer on an upper surface of the fin structure, and extending along opposite side surfaces of the fin structure in a second direction crossing the first direction;
a gate electrode on the semiconductor cap layer and extending in the second direction;
a gate insulating film between the semiconductor cap layer and the gate electrode; and
a source/drain region connected to one of the side surfaces of the fin structure in the first direction,
wherein the plurality of first semiconductor patterns comprise silicon germanium (SiGe) and the plurality of second semiconductor patterns comprise silicon (Si), and
wherein each of the plurality of first semiconductor patterns has a first germanium (Ge) content gradient that increases toward a first center thereof in a vertical thickness direction thereof, and a first Ge content in the first center of each of the first semiconductor patterns is in a first range of 25% to 35%.

2. The semiconductor device of claim 1, wherein the plurality of second semiconductor patterns and the semiconductor cap layer comprise the same semiconductor material.

3. The semiconductor device of claim 1, wherein the semiconductor cap layer comprises silicon (Si).

4. The semiconductor device of claim 3, wherein a second Ge content gradient of each of the plurality of first semiconductor patterns increases toward a second center thereof in the second direction, and a second Ge content in the second center of each of the first semiconductor patterns is in a second range of 25% to 35%.

5. The semiconductor device of claim 1, further comprising internal spacers on opposite side surfaces of the plurality of first semiconductor patterns in the first direction,
wherein the internal spacers are between the plurality of second semiconductor patterns.

6. The semiconductor device of claim 5, wherein the internal spacers comprise silicon nitride (SiN), silicon carbonitride (SiCN), silicon oxynitride (SiON), silicon boron nitride (SiBN), silicon oxycarbonitride (SiOCN), silicon boron carbonitride (SiBCN), and/or silicon oxycarbide (SiOC).

7. The semiconductor device of claim 1, further comprising gate spacers on opposite side surfaces, respectively, of the gate electrode in the first direction.

8. The semiconductor device of claim 7, wherein the semiconductor cap layer extends between the gate electrode and inner sidewalls of the gate spacers.

9. The semiconductor device of claim 1, further comprising a contact plug connected to the source/drain region.

10. The semiconductor device of claim 9, wherein a lower surface of the contact plug is in a recess of the source/drain region and is at a level that is lower than an upper surface of an uppermost one of the plurality of second semiconductor patterns.

11. A semiconductor device comprising:
a substrate;
a fin structure having a plurality of first semiconductor patterns and a plurality of second semiconductor patterns alternately stacked on the substrate;

a gate electrode on an upper surface of the fin structure, and extending along opposite side surfaces of the fin structure;

a gate insulating film between the fin structure and the gate electrode; and source/drain regions connected to the opposite side surfaces, respectively, of the fin structure, wherein the plurality of first semiconductor patterns comprise silicon germanium (SiGe), each of the plurality of first semiconductor patterns has a germanium (Ge) content gradient that increases toward a center thereof in a vertical thickness thereof, and a Ge content in the center of each of the first semiconductor patterns is in a range of 25% to 35%.

12. The semiconductor device of claim 11, further comprising a semiconductor cap layer between the fin structure and the gate insulating film, wherein the plurality of second semiconductor patterns and the semiconductor cap layer comprise silicon (Si).

13. The semiconductor device of claim 11, further comprising internal spacers on opposite side surfaces of the plurality of first semiconductor patterns, wherein the internal spacers are adjacent the source/drain regions and are between the plurality of second semiconductor patterns.

14. A semiconductor device comprising:

a substrate;

a first transistor in a first region of the substrate, the first transistor including:
 a plurality of channel layers spaced apart from each other in a direction perpendicular to an upper surface of the substrate;
 a first gate electrode surrounding the plurality of channel layers;
 a first gate insulating film between the plurality of channel layers and the first gate electrode; and
 first source/drain regions on opposite side surfaces, respectively, of the plurality of channel layers, and connected to each of the plurality of channel layers;

a second transistor in a second region of the substrate, the second transistor including:
 a fin structure having a plurality of first semiconductor patterns and a plurality of second semiconductor patterns, alternately stacked;
 a second gate electrode on an upper surface and side surfaces of the fin structure;
 a second gate insulating film between the fin structure and the second gate electrode; and
 second source/drain regions on the side surfaces, respectively, of the fin structure and connected to the plurality of first semiconductor patterns;

first internal spacers on opposite side surfaces, respectively, of the first gate electrode, wherein the first internal spacers are adjacent the first source/drain regions and are between the plurality of channel layers; and second internal spacers on opposite side surfaces, respectively, of the plurality of first semiconductor patterns, wherein the second internal spacers are adjacent the second source/drain regions and are between the plurality of second semiconductor patterns, wherein the plurality of first semiconductor patterns comprise silicon germanium (SiGe) having a germanium (Ge) content in a range of 25% to 35%.

15. The semiconductor device of claim 14, further comprising a semiconductor cap layer between the fin structure and the second gate insulating film.

16. The semiconductor device of claim 14, wherein each of the plurality of first semiconductor patterns has a Ge content gradient that increases toward a center thereof in the direction.

17. The semiconductor device of claim 14, wherein a thickness of the first gate insulating film is 2 nanometers (nm) or less, and a thickness of the second gate insulating film is in a range of 3 to 10 nm.

18. The semiconductor device of claim 14, wherein the plurality of second semiconductor patterns are at substantially the same level as, and comprise the same semiconductor material as, respective ones of the plurality of channel layers.

19. The semiconductor device of claim 14, wherein the first transistor comprises a gate-all-around (GAA) transistor, and wherein the second gate electrode comprises metal on the plurality of first semiconductor patterns.

* * * * *